(12) United States Patent
Hiramatsu et al.

(10) Patent No.: US 6,967,312 B2
(45) Date of Patent: Nov. 22, 2005

(54) SEMICONDUCTOR MANUFACTURING/ TESTING CERAMIC HEATER, PRODUCTION METHOD FOR THE CERAMIC HEATER AND PRODUCTION SYSTEM FOR THE CERAMIC HEATER

(75) Inventors: Yasuiji Hiramatsu, Ibi-gun (JP); Yasutaka Ito, Ibi-gun (JP); Satoru Kariya, Ibi-gun (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 10/070,443

(22) PCT Filed: Jul. 19, 2001

(86) PCT No.: PCT/JP01/06287

§ 371 (c)(1),
(2), (4) Date: Jun. 24, 2002

(87) PCT Pub. No.: WO02/07195

PCT Pub. Date: Jan. 24, 2002

(65) Prior Publication Data

US 2002/0179592 A1 Dec. 5, 2002

(30) Foreign Application Priority Data

Jul. 19, 2000  (JP) ...................................... 2000-219671

(51) Int. Cl.$^7$ .............................................. H05B 3/68
(52) U.S. Cl. ............................... 219/444.1; 219/465.1; 219/466.1; 219/467.1; 219/543; 219/544; 219/548; 219/460.1; 29/610.1; 29/611; 29/620
(58) Field of Search .......................... 219/444.1, 460.1, 219/461.1, 465.1, 466.1, 467.1, 468.1, 543, 544, 546–548, 121.68, 121.67, 121.69; 118/724, 725; 29/610.1, 611, 620

(56) References Cited

U.S. PATENT DOCUMENTS 3,699,649 A * 10/1972 McWilliams .................. 29/610
3,881,162 A *  4/1975 Caddock ....................... 338/61
4,160,897 A *  7/1979 Makino ....................... 219/543

(Continued)

FOREIGN PATENT DOCUMENTS

| EP | 1 109 423 | 6/2001 |
| JP | 40-701 | 1/1965 |
| JP | 63-299070 | 12/1988 |

(Continued)

OTHER PUBLICATIONS

U.S. Appl. No. 10/070,443, filed Jun. 24, 2002, Hiramatsu et al.
U.S. Appl. No. 10/746,081, filed Dec. 29, 2003, Hiramatsu et al.
U.S. Appl. No. 10/755,308, filed Jan. 13, 2004, Hiramatsu et al.
U.S. Appl. No. 10/766,027, filed Jan. 29, 2004, Ito et al.

*Primary Examiner*—Shawntina Fuqua
(74) *Attorney, Agent, or Firm*—Oblon, Spivak, McClelland, Maier & Neustadt, P.C.

(57) ABSTRACT

A process for producing a ceramic heater includes forming a resistance heating element on a surface of a ceramic substrate. The resistance heating element is divided into plural sections. Resistivities of the plural sections are measured, respectively. Each of the plural sections is trimmed according to a comparison between the resistivities of the plural sections.

12 Claims, 14 Drawing Sheets

U.S. PATENT DOCUMENTS

| | | | | |
|---|---|---|---|---|
| 4,670,734 | A | * 6/1987 | Caddock | 338/61 |
| 4,804,823 | A | 2/1989 | Okuda et al. | |
| 5,554,839 | A | 9/1996 | Tsuruta et al. | |
| 5,587,097 | A | 12/1996 | Sato et al. | |
| 5,665,260 | A | 9/1997 | Kawada et al. | |
| 5,874,710 | A | * 2/1999 | Yoshimoto et al. | 219/216 |
| 6,133,557 | A | 10/2000 | Kawanabe et al. | |
| 6,256,876 | B1 | * 7/2001 | Ohe et al. | 29/832 |
| 6,258,440 | B1 | 7/2001 | Aihara et al. | |
| 6,465,763 | B1 | 10/2002 | Ito et al. | |
| 6,475,606 | B2 | 11/2002 | Niwa | |
| 6,507,006 | B1 | 1/2003 | Hiramatsu et al. | |
| 6,677,557 | B2 | 1/2004 | Ito et al. | |
| 2002/0043527 | A1 | 4/2002 | Ito | |
| 2003/0015521 | A1 | 1/2003 | Ito | |

FOREIGN PATENT DOCUMENTS

| | | | |
|---|---|---|---|
| JP | 4-249090 | * | 4/1992 |
| JP | 4-249090 | | 9/1992 |
| JP | 4-324276 | | 11/1992 |
| JP | 5-190260 | | 7/1993 |
| JP | 5-258843 | | 10/1993 |
| JP | 6-202511 | | 7/1994 |
| JP | 6-32485 | | 11/1994 |
| JP | 6-324584 | | 11/1994 |
| JP | 8-315968 | | 11/1996 |
| JP | 9-40481 | | 2/1997 |
| JP | 9-306642 | | 11/1997 |
| JP | 10-305606 | | 11/1998 |
| JP | 11-40330 | | 2/1999 |
| JP | 11-251040 | | 9/1999 |
| JP | 11-312570 | | 11/1999 |
| JP | 11317283 | * | 11/1999 |
| JP | 2000-101315 | | 4/2000 |
| JP | 2001-244059 | | 9/2001 |

* cited by examiner

A    B    C (a)

(b)

SEMICONDUCTOR MANUFACTURING/ TESTING CERAMIC HEATER, PRODUCTION METHOD FOR THE CERAMIC HEATER AND PRODUCTION SYSTEM FOR THE CERAMIC HEATER

TECHNICAL FIELD

The present invention relates to a ceramic heater (hot plate) for a semiconductor producing/examining device used mainly to produce or examine a semiconductor, a process of producing the same, and a production system of a ceramic heater for a semiconductor producing/examining device.

BACKGROUND ART

Hitherto, a heater, a wafer prober and the like wherein a base material made of metal such as stainless steel or aluminum alloy is used has been used as a semiconductor producing/examining device and the like, examples of which include an etching device and a chemical vapor deposition device.

However, a heater made of metal has a thick heater plate; therefore, the heater has such problems that the heater has a large weight and is bulky. Furthermore, these problems result in a problem about its temperature following property.

Thus, JP Kokai Hei 11-40330 and so on disclose a ceramic heater for a semiconductor producing/examining device wherein a nitride ceramic or a carbide ceramic, which has a high heat conductivity and a large intensity, is used as a substrate and heating elements formed by sintering metal particles are set up on the surface of a plate made of such a ceramic (ceramic substrate).

Examples of the method of forming the resistance heating elements when such a ceramic heater for a semiconductor producing/examining device is manufactured include the following methods.

A ceramic substrate having a given shape is firstly manufactured. In the case that resistance heating elements are formed by coating method after manufacturing the ceramic substrate, a conductor containing paste layer having a heating element pattern is formed on the surface of this ceramic substrate by such a method as screen printing and then the paste layer is heated and fired, thereby forming the resistance heating elements.

In the case that resistance heating elements are formed by a plating method or a physical vapor deposition method such as sputtering, a metal layer is formed on a given area in a ceramic substrate by the above-mentioned method and subsequently the resistance heating elements having a given pattern are formed by making an etching resist to cover a heating element pattern portion and then conducting an etching treatment.

Resistance heating elements having a given resistance heating element pattern can also be formed on the surface of a ceramic substrate, through one processing, by covering portions other than the heating element pattern with resin and the like firstly and then conducting above-mentioned treatment.

SUMMARY OF THE INVENTION

In the method of sputtering, plating and the like, however, in order to form the resistance heating elements having the given pattern, it is necessary to form an etching resist, a plating resist and the like on the surface of the ceramic substrate by photolithography although it has an advantage that a precise pattern can be formed. Thus, a problem that the manufacturing costs become expensive arises.

On the other hand, in the method using a conductor containing paste, resistance heating elements can be formed at a relatively low cost by using such a manner as screen printing, as described above. However, in the case of attempting to form a minute pattern, a short-circuit and the like is caused by a trifling mistake at the time of the printing. As a result, a problem that resistance heating elements having a minute pattern are not easily formed is caused. Moreover, this method has a problem that the thickness of the conductor containing paste is dispersed to result in dispersion in the resistance value.

In light of the above-mentioned problems, the present inventors made eager investigations to form a minute heating element pattern at relatively low costs. As a result, the inventors have found out that a minute heating element pattern can be formed by forming a conductor layer, for example, in the form of concentric circles, each of which has a given width, and then removing portions other than a heating element pattern with a laser radiation equipment, a grinding apparatus and the like.

At the same time, the inventors have found out that by radiating a laser ray or performing grinding when or after a resistance heating element is formed by the above-mentioned process, the thickness of the resistance heating element is adjusted or a part thereof is removed so that the resistance value thereof can be adjusted. Thus, the present inventions have been completed.

That is, the first aspect of the present invention is a ceramic heater for a semiconductor-producing/examining device comprising a ceramic substrate and a resistance heating element formed on the ceramic substrate, wherein trimming is performed on the resistance heating element.

In the first aspect of the present invention, the above-mentioned trimming may be performed on a surface of a resistance heating element or a part including a side face of the resistance heating element to remove the part thereof. And, if an electrical circuit is formed as a whole, the trimming may be performed to remove the part thereof to cause a disconnection. By such trimming, the resistance value (resistivity) can be adjusted. Therefore, even if the resistance heating element is formed by printing a conductor containing paste, dispersion in the thickness can be adjusted by the trimming.

In the first aspect of the present invention, a conductor containing paste which contains a metal or a conductor containing paste which contains a metal and an oxide is used to form the resistance heating element on the ceramic substrate; therefore, the resistance heating element is easily trimmed particularly by a laser ray. This is because a metal is evaporated and removed by a laser ray but a ceramic is not removed.

The above-mentioned trimming is desirably performed on a part including a side face of the resistance heating element. Examples of the manner of trimming the part including the side face include single cutting (reference to FIG. 8(*a*)), double reverse cutting (reference to FIG. 8(*b*)), J cutting (reference to FIG. 8(*c*)), vernier-attached L cutting (reference to FIG. 8(*d*)), double cutting (reference to FIG. 9(*e*)), serpent cutting (reference to FIG. 9(*f*)), C cutting (reference to FIG. 9(*g*)), T cutting (reference to FIG. 9(*h*)) and L cutting (reference to FIG. 10(*i*)), as illustrated in FIGS. 8 to 10.

Also, as illustrated in FIG. 11, trimming of making one or more grooves 120 in a surface of the resistance heating element 12 may be performed. There is no possibility that this method causes disconnection of the heating element. Also, the resultant resistance heating element has excellent endurance.

The second aspect of the present invention is a ceramic heater for a semiconductor-producing/examining device comprising a ceramic substrate and a resistance heating element formed on the ceramic substrate, wherein the resistance heating element is formed by performing trimming at least a part of a parallel circuit.

Specifically, this heater is a ceramic heater for a semiconductor-producing/examining device comprising a ceramic substrate and resistance heating elements formed on the ceramic substrate, wherein: said resistance heating elements comprises resistance heating elements formed in parallel to each other, and a resistance heating element for connection formed between said resistance heating elements formed in parallel to electrically connect both of them; and trimming is performed to at least a part of the resistance heating element for connection and the resistance heating elements formed in parallel.

In the second aspect of the present invention, some parts of the resistance heating elements formed in parallel are appropriately trimmed and cut into a ladder form and the like form, to adjust the resistance value thereof.

For example, as illustrated in FIG. 12A, a resistance heating element 22c for connection is arranged between resistance heating elements 22a, 22b formed in parallel to each other, to obtain a resistance heating element in a ladder form, and then some parts of this ladder-form resistance heating element are trimmed as illustrated in B and C, to adjust the resistance value. As illustrated in B, if some parts of the resistance heating element 22c for connection are trimmed, the resistance value thereof drops. As illustrated in C, if the resistance heating elements 22a, 22b formed in parallel are trimmed to make the resistance heating element length substantially long, the resistance value rises.

The third aspect of the present invention is a ceramic heater for a semiconductor-producing/examining device comprising a ceramic substrate and resistance heating elements formed on the ceramic substrate, wherein the thickness of a given area of the resistance heating element is different from the thickness of other part.

In the third aspect of the present invention, the resistance value (resistivity) of the resistance heating element is adjusted by changing the thickness of the resistance heating element. If the thickness of the resistance heating element is made thin, the resistance value (resistivity) becomes large. That is, in order to adjust the resistance value (resistivity) thereof: in case the resistance value (resistivity) in some given position is large, the thickness of the resistance heating element in positions other than this position can be adjusted to be thin; and contrarily, if the resistance value (resistivity) in some given position is small, the resistance value (resistivity) of the resistance heating element can also be adjusted by making the thickness of this position thin.

The fourth aspect of the present invention is a process for producing a ceramic heater for a semiconductor-producing/examining device, wherein, after forming a conductor layer on a given area of a surface of a ceramic substrate, a resistance heating element in a given pattern is formed by trimming a part of the conductor layer.

By trimming a part of the above-mentioned conductor layer, a given pattern (a spiral, concentric circles, winding lines and the like) can be obtained from the conductor layer stretching in a plane form. As described above, by removing a part including a side face of the conductor layer or a part of a surface thereof, the resistance value can be adjusted. Furthermore, by adjusting the thickness of the resistance heating element, the resistance value (resistivity) of the resistance heating element can be adjusted (reference to FIG. 2).

The fifth aspect of the present invention is a process for producing a ceramic heater for a semiconductor-producing/examining device, wherein, after forming the conductor layer on the given area of the surface of the ceramic substrate, the resistance heating element in the given pattern is formed by applying a laser ray to the conductor layer and trimming a part thereof.

A conductor containing paste which contains a metal, or a conductor containing paste which contains a metal and an oxide is used to form the resistance heating element on the ceramic substrate; therefore, the resistance heating element is easily trimmed particularly by a laser ray. This is because a metal is evaporated and removed by a laser ray but a ceramic is not removed.

A ceramic has excellent heat resistance. Thus, by trimming by a laser ray, the ceramic is not denatured and the resistance heating element does not exfoliate.

Accordingly, trimming wherein adjustment of laser power is unnecessary and precise trimming wherein no removal residues are generated can be realized, which are entirely different from laser trimming on a semiconductor wafer or a print circuit board.

The sixth aspect of the present invention is a process for producing a ceramic heater for a semiconductor-producing/examining device, wherein, after obtaining a conductor layer by forming a conductor containing paste layer on a given area of a surface of a ceramic substrate and subsequently conducting heating and firing of it, a resistance heating element in a given pattern is formed by applying a laser ray to the conductor layer and trimming a part thereof.

In the sixth aspect of the present invention, a conductor containing paste is fired to form a resistance heating element, and subsequently the resistance heating element is trimmed by a laser ray. Because of the trimming by the laser ray after being fired, a change in the resistivity of the resistance heating element generated by the firing can be amended.

The seventh aspect of the present invention is a process for producing a ceramic heater for a semiconductor-producing/examining device wherein, after forming a conductor containing paste layer in a heating element pattern on a surface of a ceramic substrate, or after forming a conductor layer in a heating element pattern on a surface of a ceramic substrate, the thickness of a resistance heating element is adjusted by applying a laser ray to the conductor containing paste layer or the conductor layer.

In the seventh aspect of the present invention, the thickness is adjusted by the laser ray; therefore, the removed heating element does not adhere thereon and control into an even thickness can be realized in a short time.

The eighth aspect of the present invention is a production system used for producing a ceramic heater for a semiconductor-producing/examining device by trimming a conductor layer on a surface of a ceramic substrate to form a resistance heating element pattern wherein the production system comprises:

a table for placing a ceramic substrate;

a camera for taking an image of a conductor layer;

a memory unit for memorizing data;

a galvano mirror for deflecting a laser ray;

an input unit for inputting data;

an operation unit for calculating data; and a control unit for controlling the table and/or the galvano mirror, the production system being constituted to perform trimming by the following steps:

data on a resistance heating element pattern and/or data for trimming are input from the input unit and stored in the memory unit;

the position of the conductor layer is read by the camera;

a control data for controlling the table and/or the galvano mirror for trimming is calculated on the basis of the obtained data of the position and the pattern and/or the data for trimming at the operation unit, and then the obtained control data is stored in the memory unit; and further the control data is transmitted from the memory unit to the control unit, and then trimming is performed by applying a laser ray to the conductor layer.

By the use of the production system according to the eighth aspect of the present invention, it is possible to carry out the following promptly: the formation of the heating element pattern (a spiral, concentric circles and winding lines); partial removal of the surface of the heating element; removal of a part including a side face; control of the thickness of the film; and so on.

The ninth aspect of the present invention is a production system used for producing a ceramic heater for a semiconductor-producing/examining device by trimming a conductor layer on a surface of a ceramic substrate to form a resistance heating element pattern, wherein the production system comprises:

a table for placing a ceramic substrate;

a camera for taking an image of a conductor layer;

a memory unit for memorizing data;

a galvano mirror for deflecting a laser ray;

an input unit for inputting data;

an operation unit for calculating data;

a control unit for controlling the table and/or the galvano mirror, and a resistivity measuring unit, the production system being constituted to perform trimming by the following steps:

at least one selected from data on a resistance heating element pattern, data on trimming and data on a desired resistivity is/are input from the input unit and stored in the memory unit;

also, the resistivity of the conductor layer is measured and data of the resistivity is stored in the memory unit;

the position of the conductor layer is read by the camera;

a control data for controlling the table and/or the galvano mirror for trimming is calculated on the basis of at least one selected from the data on the resistance heating element pattern, the data on trimming and the data on the desired resistivity, with the obtained data of the position and the resistivity, and then the obtained control data is stored in the memory unit; and further the control data is transmitted from the memory unit to the control unit, and then trimming is performed by applying a laser ray to the conductor layer.

In the production system according to the ninth aspect of the present invention, the resistance value thereof is measured, then based on the resistance value, control data as to what kind of trimming should be preformed in order to obtain a desired resistance value is calculated. In accordance with the control data, trimming is performed.

For example, as illustrated in FIG. 13, in the ninth aspect of the present invention, a resistance heating element 12 pattern is divided to plural sections ($l_1$ to $l_6$), the resistance value (resistivity) of each of the sections is measured and then trimming is performed in each of the sections. Thus, dispersion in the resistance value of the heating element pattern can be precisely amended.

The tenth aspect of the present invention is a process of producing a ceramic heater for a semiconductor-producing/examining device, wherein, after forming a conductor layer on a given area of a surface of a ceramic substrate, a heating element pattern is formed by trimming the conductor layer in a way of performing a grinding treatment.

In the tenth aspect of the present invention, by the grinding treatment, the conductor layer is trimmed to obtain a heating element pattern. Thus, the adjustment of the resistance value in a wide area becomes possible. In this invention, the conductor layer is formed on the ceramic substrate; thus, the ceramic substrate is not damaged by vibration or stress attributed to the grinding treatment, which is entirely different from the case in which the conductor layer is formed on a resin or a semiconductor wafer.

When the grinding treatment is conducted, a mask which is formed to cover the conductor layer is placed on the surface of the ceramic substrate on which the conductor layer is formed, and next the grinding treatment is carried out.

In the case that a grinding device such as a belt sander 60 (a device which causes a rotation of a grinding tape by a contact roller) illustrated in FIG. 14 is used, such a mask is unnecessary. Specifically, by: forming resistance heating element 12 in a given pattern on the surface of a ceramic substrate 11; and subsequently grinding the resistance heating element 12, the thickness thereof is adjusted to control the resistance value (resistivity) thereof.

In the case that this belt sander 60 is used, the grinding is performed under the following conditions: the width of the grinding tape: 1 to 5000 mm, abrasive particles: #100 to #10000, moving speed of the object to be ground (heating element): 10 to 3000 mm/minute, moving speed of the tape: 10 to 5000 mm/minute, and the hardness of the contact roller rubber: 10 to 100 degrees.

The above-mentioned first to tenth aspect of the present invention will be described according to embodiments hereinafter. Since these inventions overlap partially with each other, the following will properly describe these inventions without attaching any number thereto.

Figure 1:
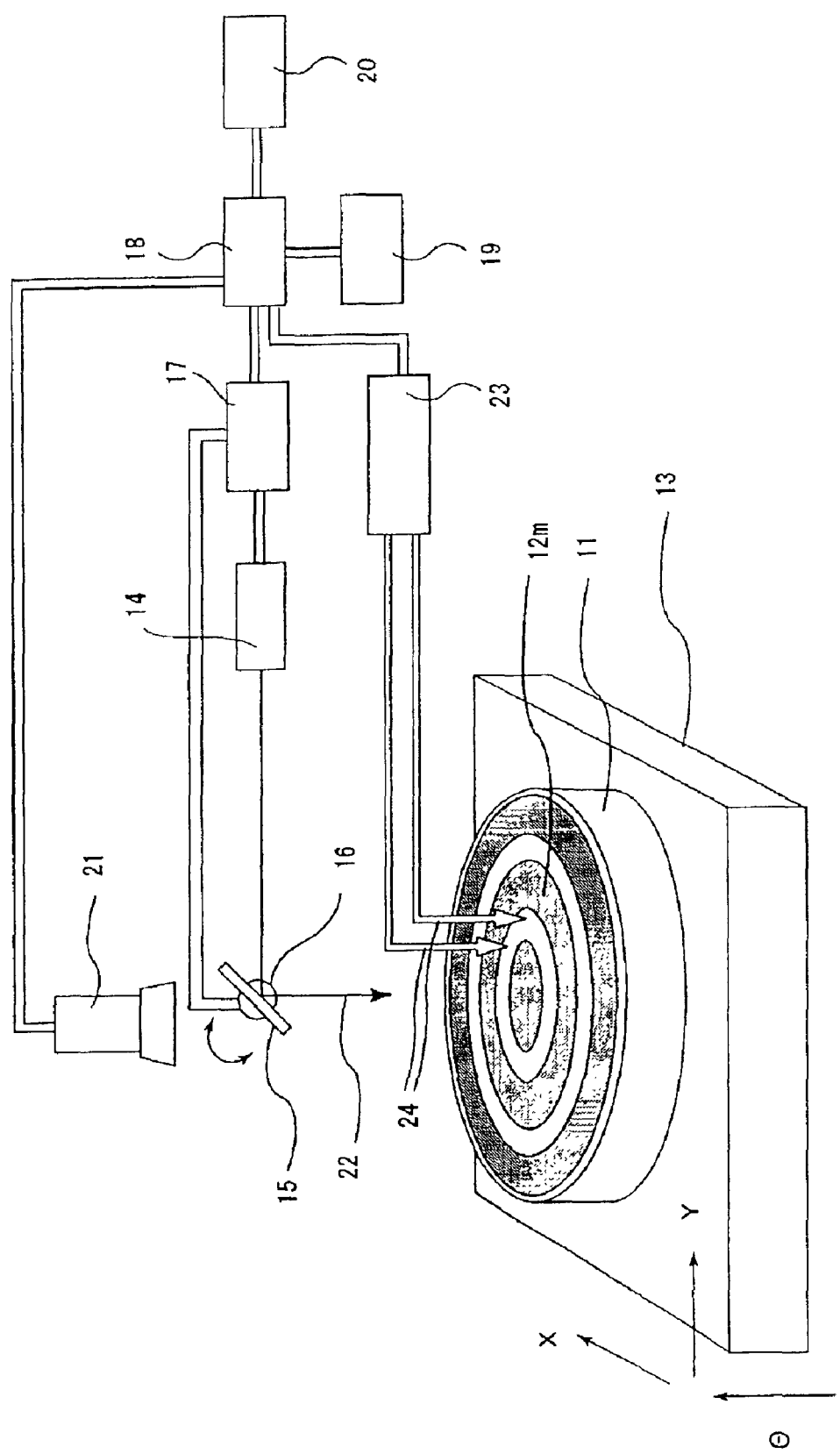
FIG. 1 is a bottom view which illustrates the general construction of a production system of a ceramic heater for a semiconductor producing/examining device of the present invention.

EXPLANATION OF SYMBOLS 11 ceramic substrate
11a heating face
11b bottom face
12 (12a to 12d), 22a, 22b, 22c resistance heating element
12m conductor layer
13 table
14 laser radiation equipment
15 galvano mirror
16 motor
17 control unit
18 memory unit
19 operation unit
20 input unit
21 camera
22 laser ray
23 resistance-measuring unit
24 tester pin
33 external terminal
34 bottomed holes
35 through hole
36 lifter pin
39 silicon wafer
40, 50 mask
41, 51 opening
42a, 42b, 42c, 52a, 52b, 52c mask portion
60 belt sander
120 groove
420 connection portion

DETAILED DISCLOSURE OF THE INVENTION

A ceramic heater for a semiconductor producing/examining device of the present invention is a ceramic heater for a semiconductor-producing/examining device comprising a ceramic substrate and a resistance heating element formed on the ceramic substrate, wherein trimming is performed on the resistance heating element.

The ceramic heater for a semiconductor producing/examining device may be referred to merely as the ceramic heater in the following description.

In this ceramic heater, the face opposite to its heating element-formed face is a heating face for placing an object to be heated, or heating the object while keeping a given interval between the object and the surface of the substrate by supporting pins and the like set on the ceramic substrate (hereinafter referred to as the heating face). The resistance heating element is subjected to a trimming treatment to adjust the resistance value thereof. Thus, an even resistance value (resistivity) can be obtained as a whole. As a result, when this ceramic heater is used to heat the object to be heated such as a silicon wafer and the like, a temperature distribution on the heating face becomes even so that the object to be heated can be evenly heated.

The above-mentioned trimming is performed on a part including a side of the resistance heating element, or a surface of the resistance heating element.

Figure 8:
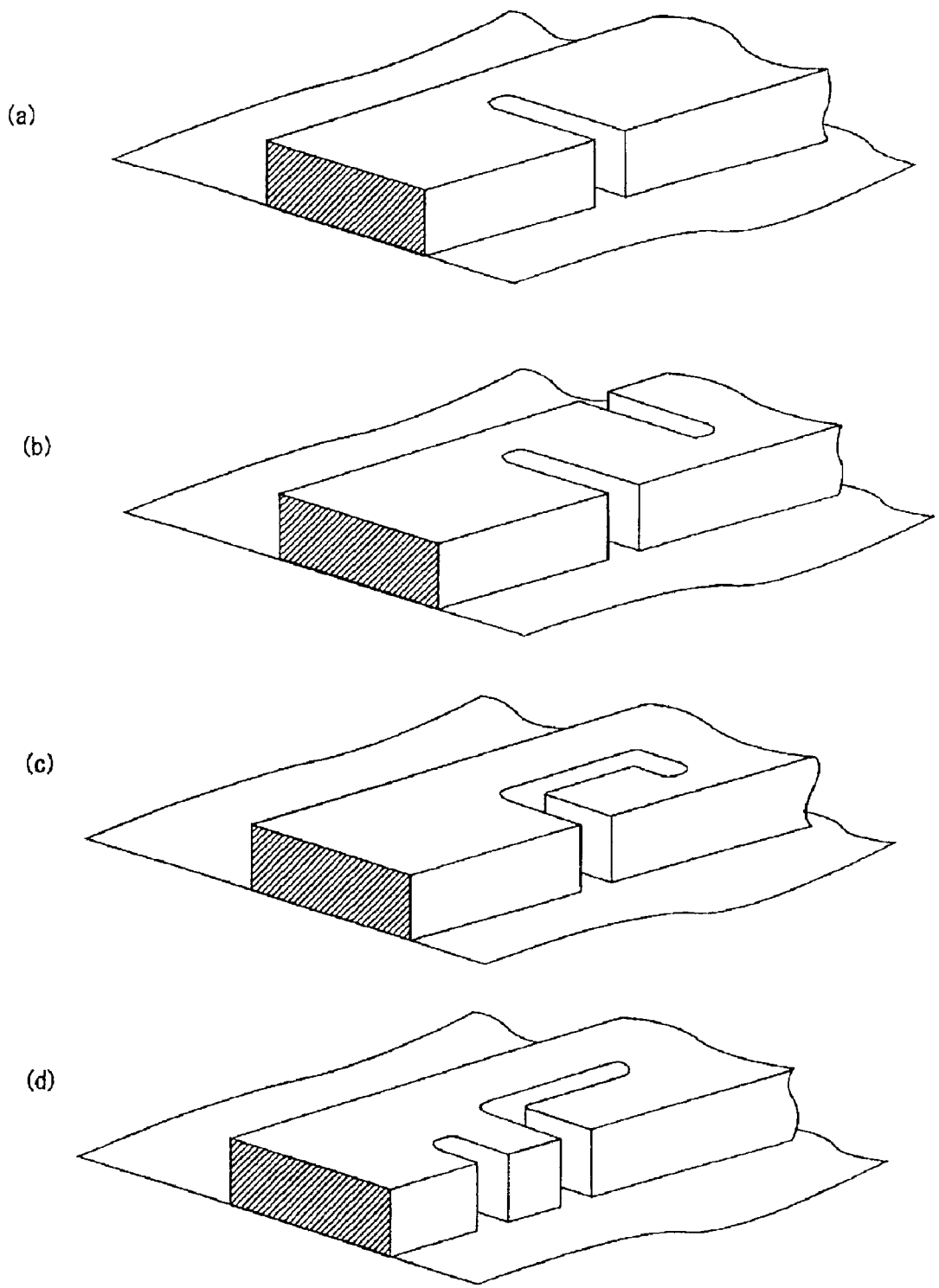
FIG. 8 are perspective views, each of which schematically illustrates a form when trimming is applied to a part including a side face of a resistance heating element.
Figure 9:
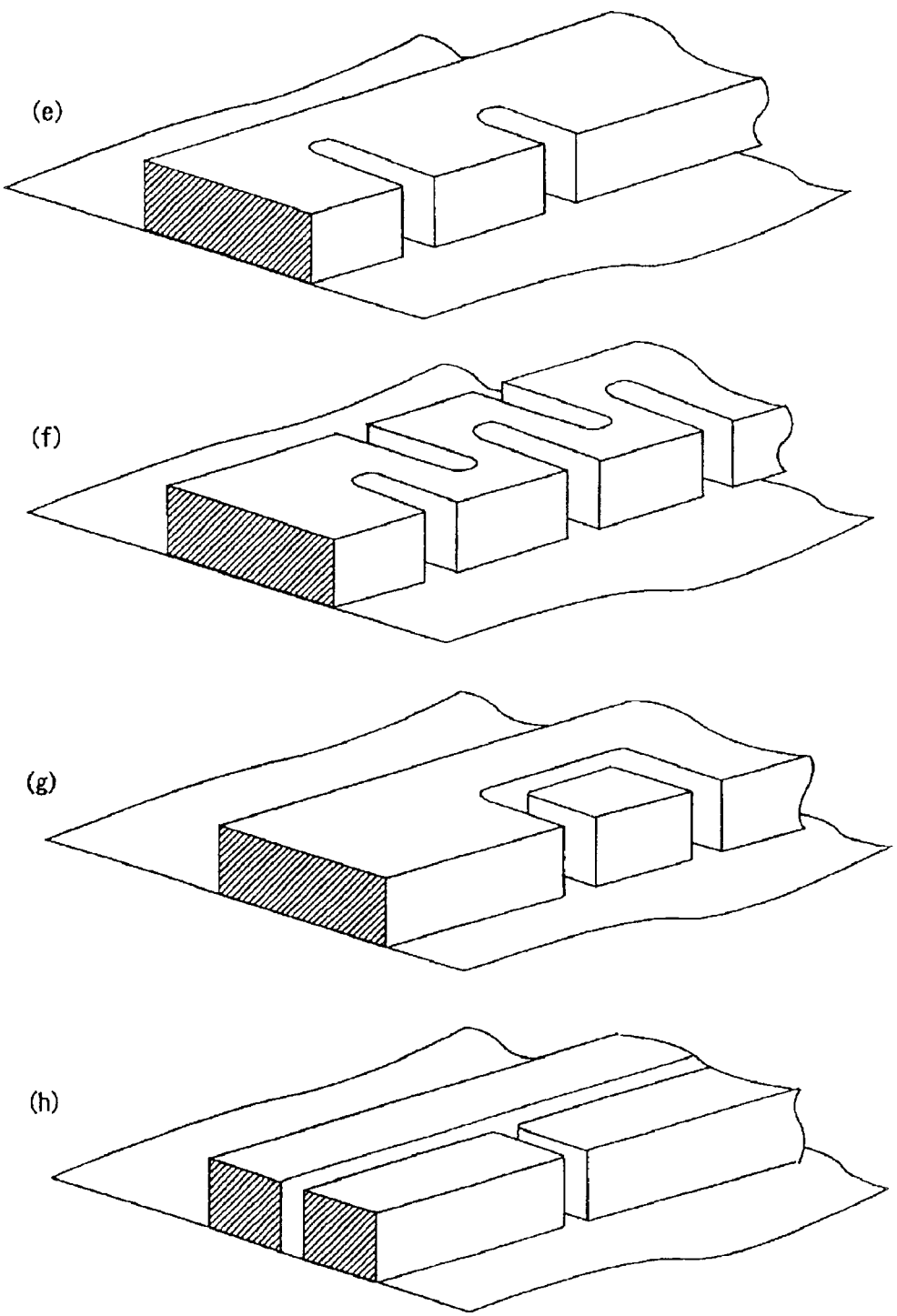
FIG. 9 are perspective views, each of which schematically illustrates a form when trimming is applied to a part including a side face of a resistance heating element.
Figure 10:
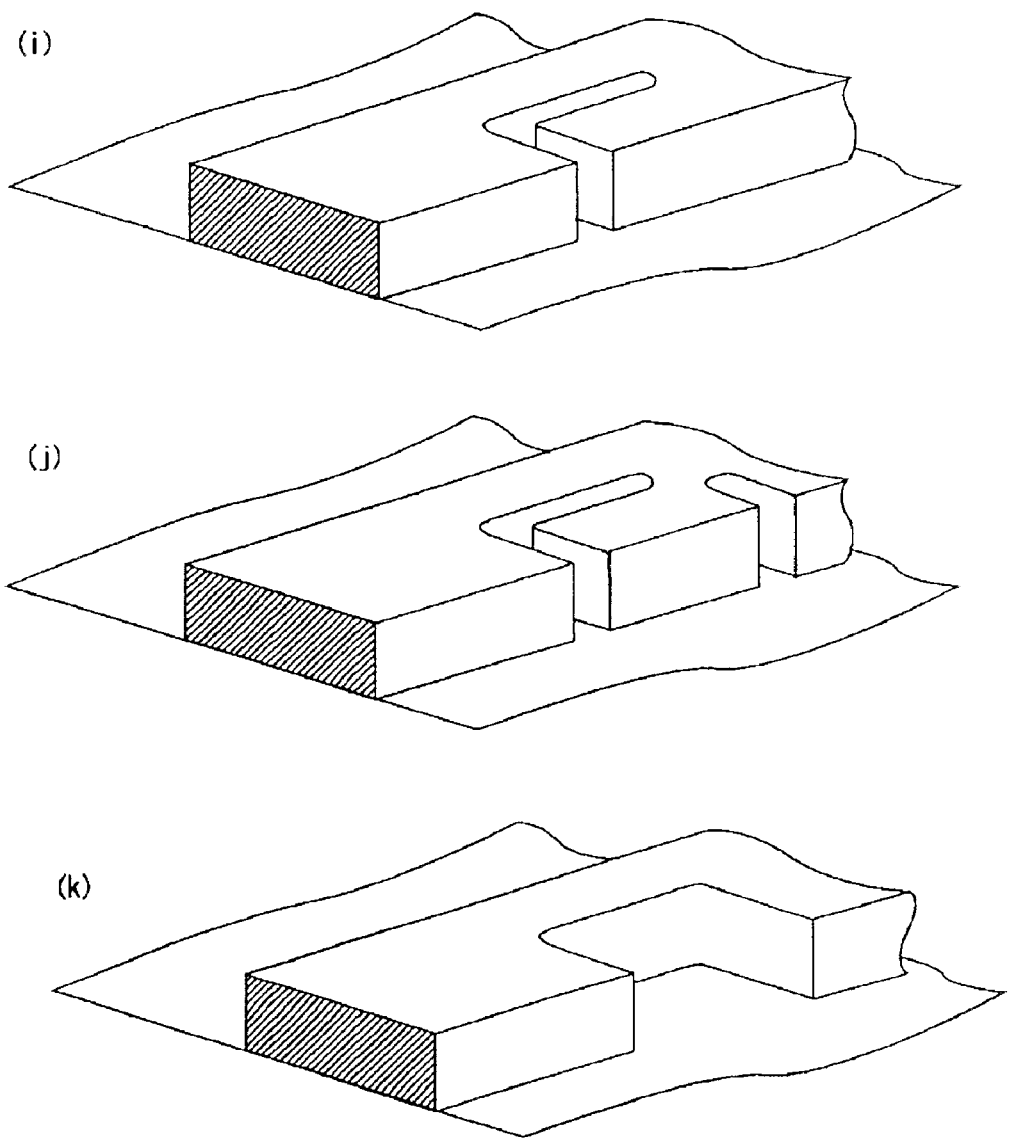
FIG. 10 are perspective views, each of which schematically illustrates a form after trimming is applied to a part including a side face of a resistance heating element.

FIG. 8 are perspective views, each of which illustrates a form of the resistance heating element in the case that trimming is applied to a part including a side face thereof. Examples of the trimming performed to the part including the side face include single cutting (reference to FIG. 8(a)), double reverse cutting (reference to FIG. 8(b)), J cutting (reference to FIG. 8(c)), vernier-attached L cutting (reference to FIG. 8(d) and FIG. 10(j)), double cutting (reference to FIG. 9(e)), serpent cutting (reference to FIG. 9(f)), C cutting (reference to FIG. 9(g)), T cutting (reference to FIG. 9(h)), L cutting (reference to FIG. 10(i)) and scanning cutting (FIG. 10(k)) as illustrated in FIGS. 8 to 10. In these drawings, a ceramic substrate is exposed from a groove formed by trimming. However, it is allowable that the resistance heating element is not deeply trimmed until the ceramic substrate is exposed and a groove is made in the surface.

Figure 11:
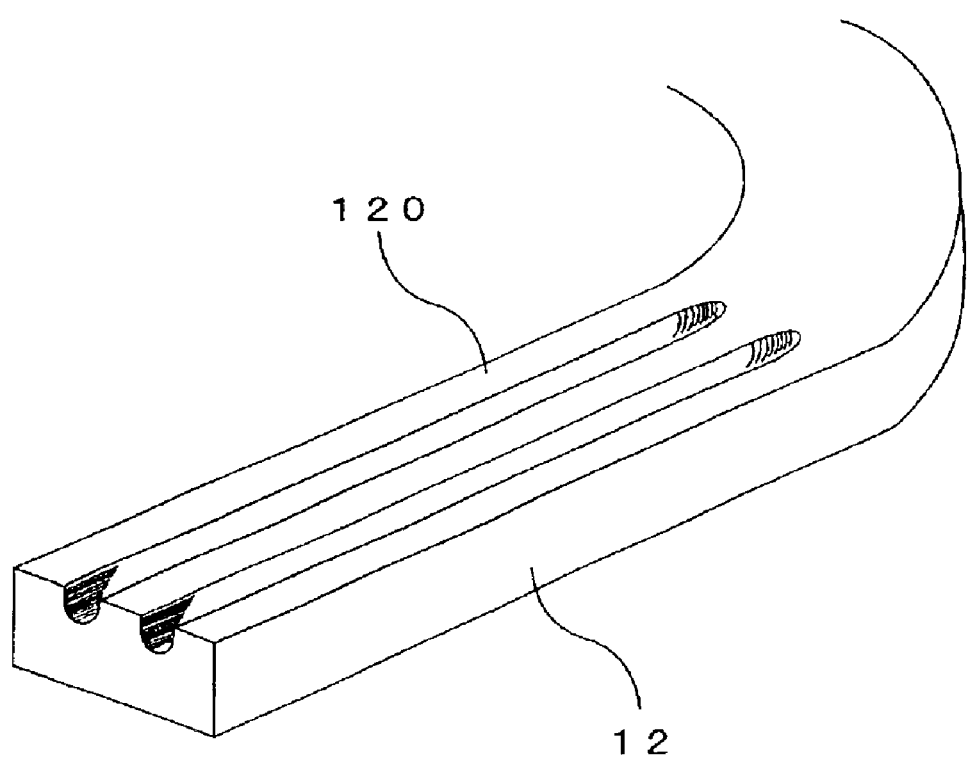
FIG. 11 is a perspective view which schematically illustrates a form after trimming is applied to a surface of a resistance heating element.

FIG. 11 is a perspective view illustrating a resistance heating element 12 wherein its surface was subjected to trimming. By making grooves 120 in the surface of the resistance heating element 12 in this way, the resistance value (resistivity) can be adjusted.

An example of the method of trimming the surface is a method of drawing a straight line or a curved line in the surface of the resistance heating element 12. Plural straight lines or curved lines may be drawn.

Figure 2:
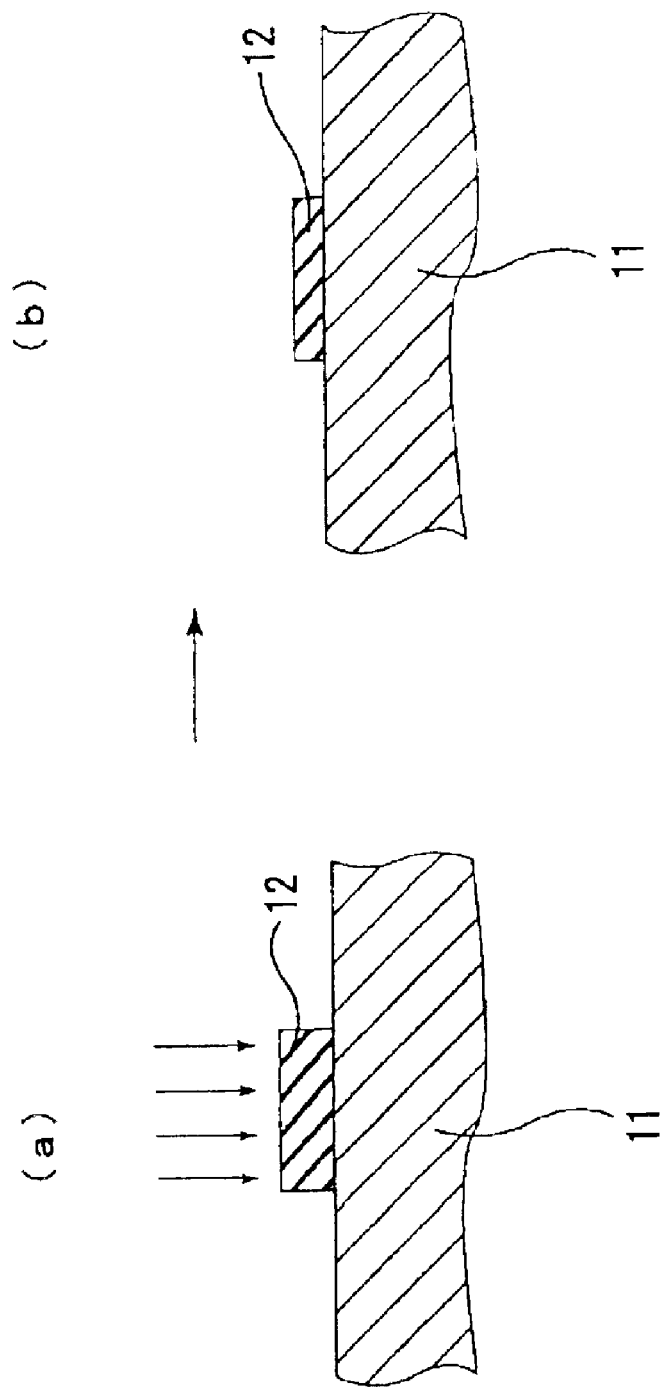
FIGS. 2(a) to (b) are sectional views which schematically illustrate a method of adjusting the thickness of a resistance heating element with a laser ray.

Trimming may be performed in the thickness direction, as illustrated in FIG. 2. Since trimming is applied to each of given sections, the thickness of the resistance heating element in the section having a low resistance value (resistivity) can be made to be smaller than that of other sections, whereby the resistance values (resistivities) of the respective sections become equal to each other. Therefore, the calorific values thereof also become equal. As a result, local unevenness of generated heat is corrected.

Figure 12:
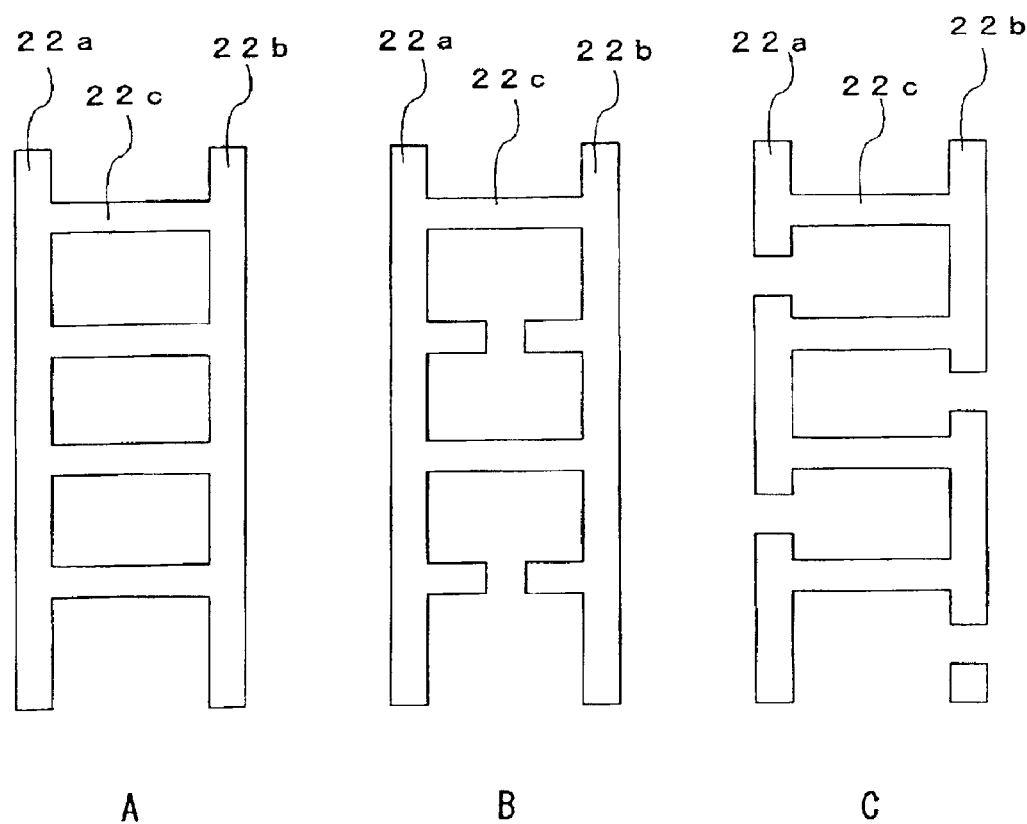
FIGS. 12A to C are plan views, each of which schematically illustrates a resistance heating element in a ladder form, and a form when trimming is applied to the resistance heating element.

Furthermore, as illustrated in FIGS. 12A to 12C, a resistance heating element in a ladder form is formed and subsequently trimming treatment is applied thereto, so as to cut some parts thereof. In this way, the resistance value can be adjusted.

That is, as illustrated in FIG. 12A, a resistance heating element $22c$ for connection is arranged between resistance heating elements $22a$, $22b$ formed in parallel to each other, to obtain a resistance heating element 22 in a ladder form, and then some parts of this ladder-form resistance heating element 22 are trimmed as illustrated in B and C, whereby the resistance value can be adjusted. As illustrated in B, if some parts of the resistance healing element $22c$ for connection are trimmed, the resistance value thereof drops. As illustrated in C, if the resistance heating elements $22a$ and $22b$ formed in parallel are trimmed to make the resistance heating element length substantially long, the resistance value rises.

Trimming of a surface or a side face is desirably performed in such a manner that the width of a groove or a cut portion will range from about 1 to 100 $\mu$m. This is because if the width is too wide, disconnection and the like is easily generated. When trimming is performed in the thickness direction, a portion corresponding to a depth of 5 to 80% of the original thickness is trimmed. This is because if the amount of trimming is too large, disconnection is caused. The spot diameter of a laser ray is adjusted to 1 to 100 $\mu$m. Depending on the form of trimming, the spot diameter may be as large as 1 to 200 mm.

Trimming is desirably performed on the basis of a value obtained by measuring the resistance value (resistivity). This is because the resistance value (resistivity) can be precisely adjusted.

Figure 13:
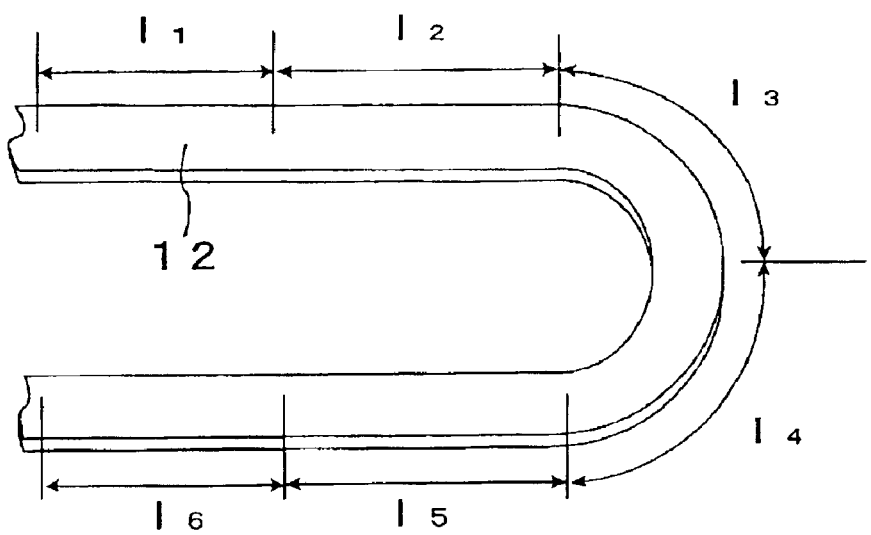
FIG. 13 is a perspective view which shows a situation in which a resistance heating element is divided to plural sections.

In the measurement of the resistance value (resistivity) the resistance heating element 12 is divided to sections $l_1$ to $l_6$ and then the resistance values (resistivities) of the respective sections are measured, as illustrated in FIG. 13. It is advisable that the section having a low resistance value (resistivity) is subjected to trimming treatment.

After the trimming treatment, the resistance value is again measured and, if necessary, trimming is further performed. That is, such resistance-value-measurement and trimming may be performed one time or may be performed two times or more.

Trimming is desirably performed after a paste of the resistance heating element is printed and then fired. This is because the resistance value varies by the firing.

First, the resistance heating element paste may be printed on a stretching surface (in the so-called spread state), and then patterned by trimming. If the paste is printed into a pattern at an initial stage in this method, dispersion in the thickness thereof is generated depending on the printing direction. However, when the paste is printed in the spread state, the paste can be printed to have an even thickness. As a result, by trimming this into a pattern, a heating element pattern having an even thickness can be obtained.

Besides, for trimming, a method of applying a laser ray may be used. A grinding method such as sand blast or a belt sander may be adopted.

The laser ray which can be used may be a YAG laser, an excimer laser (KrF), a carbon dioxide gas laser, and the like.

The following will describe a trimming system of the present invention.

FIG. 1 is a block diagram illustrating the general construction of a laser trimming equipment constituting a production system of a ceramic heater of the present invention.

As illustrated in FIG. 1, when this laser trimming is performed, the following is fixed onto a table 13: a disk-form ceramic substrate 11 on which a conductor layer $12m$ including circuits of resistance heating elements to be formed, for example, the layer $12m$ of a concentric circular shape having a given width, is formed.

This table 13 is provided with a motor etc. (not illustrated) and further the motor etc. are connected to a control unit 17. By driving the motor etc. through signals from the control unit 17, the table 13 can freely be moved into xy directions (and additionally a θ direction: the up-and-down direction).

A galvano mirror 15 is set up above this table 13. This galvano mirror 15 can freely be rotated with the motor 16. A laser ray 22 emitted from a laser radiation equipment 14 arranged above the table 13 similarly is applied to this galvano mirror 15 and reflected thereon. Thus, the reflected ray is applied to a ceramic substrate 11.

The motor 16 and the laser radiation equipment 14 are connected to the control unit 17. By driving the motor 16 and the laser radiation equipment 14 through signals from the control unit 17, the galvano mirror 15 is rotated by a given angle. Thus, the position irradiated with the laser ray can freely be set along the y directions on the ceramic substrate 11.

Thus, by moving the table 13 on which the ceramic substrate 11 is put and the galvano mirror 15 in this way, an arbitrary position on the ceramic substrate 11 can be irradiated with the laser ray 22.

A camera 21 is also set up above the table 13. With the camera, the position (x, y) of the ceramic substrate 11 can be recognized. This camera 21 is connected to a memory unit 18, thereby recognizing the position (x, y) etc. of the conductor layer $12m$ of the ceramic substrate 11. This position is irradiated with the laser ray 22.

An input unit 20 is connected to the memory unit 18, and has a keyboard etc. (not illustrated) as a terminal. Given instructions are input through the memory unit 18, keyboard, etc. to the input unit 20.

Furthermore, this laser trimming equipment is provided with an operation unit 19, which calculates the position irradiated with the laser ray 22, radiation speed, the intensity of the laser ray, etc. on the basis of data on the position and the thickness of the ceramic substrate 11 recognized by the camera 21, and the like data. On the basis of results of this calculation, instructions are supplied from the control unit 17 to the motor 16, the laser radiation equipment 14, and the like, to apply the laser ray 22 to given positions while rotating the galvano mirror 15 or moving the table 13. In this way, unnecessary portions of the conductor layer $12m$ are trimmed. In this way, resistance heating elements having a given pattern are formed.

This laser trimming equipment may have a resistance measuring unit 23 if necessary. The resistance measuring unit 23 has plural tester pins 24. By diving the resistance heating element pattern to plural sections and bringing the tester pins 24 into contact with the respective sections, the resistance values of the resistance heating elements are measured. A laser ray is then applied to given sections to perform trimming.

The following will specifically describe a process of producing a ceramic heater, using such a laser trimming equipment. Herein, a laser trimming step, which is an important step of the present invention, will be detailed, and steps other than the trimming step will briefly be described. These steps other than the trimming step will be described in more detail later.

First, a ceramic substrate is produced. A raw formed body comprising ceramic powder and resin is first produced. The method of producing this raw formed body is a method of producing granules containing ceramic powder and resin, putting the granules into a mold and the like, and applying pressing pressure thereto, or a method of producing the raw formed body by laminating green sheets and then compressing the resultant lamination. A more appropriate method is selected based on the factor such as: whether or not other conductor layers such as electrostatic electrodes are formed thereon. Thereafter, the raw formed body is degreased and fired to manufacture a ceramic substrate.

Thereafter, through holes, into which lifter pins will be inserted, and bottomed holes, in which temperature-measuring elements will be embedded, are made in the ceramic substrate.

Next, by screen printing and the like, a conductor containing paste layer is formed on this ceramic substrate 11 and in a wide area including portions which will be resistance heating elements (for example, the form of concentric circles, each of which has a given width, as illustrated in FIG. 1). The resultant workpiece is then fired to form a conductor layer 12m.

The conductor layer may be formed by a plating method or a physical vapor deposition method such as sputtering. In the case of plating, by forming a plating resist, the conductor layer 12m can be formed in the given area. Also, in the case of sputtering and the like, by performing etching in a selective manner the conductor layer 12m can be formed in the given area.

The conductor layer may be formed as a resistance heating element pattern, as will be described later.

The ceramic substrate 11 on which the conductor layer 12m is formed in the given area in this way is fixed onto a given position in the table 13.

Trimming data, data on the resistance heating element pattern, or both of the trimming data and the data on the resistance heating element pattern are beforehand input to the input unit 20, and stored in the memory unit 18. That is, data on the shape to be formed by trimming are beforehand memorized. The trimming data are data used when trimming of the side face or the surface of the resistance heating element pattern, trimming in the thickness direction or trimming of a pattern in a ladder form is performed. The data on the resistance heating element pattern are used when the conductor layer printed on a stretching surface (in the so-called spread state) is trimmed to form the resistance heating element pattern. Of course, these can be used together.

In addition to these data, desired resistance value data may be input and stored in the memory unit 18. This process comprises the steps of: measuring the resistance value (resistivity) actually in the resistance measuring unit 23; calculating a difference thereof from a desired resistance value (resistivity); calculating how to perform trimming in order to amend this actual value to the desired resistance value (resistivity); and generating control data.

Next, the fixed ceramic substrate 11 is photographed with the camera 21 to memorize the position where the conductor layer 12m is being formed in the memory unit 18.

On the basis of the data on the position of the conductor layer, data on the shape to be formed by trimming, and the data on the required resistance value, calculations are carried out in the operation unit 19. The results are memorized as control data in the memory unit 18.

On the basis of the calculation results, control signals are generated from the control unit 17 to apply a laser ray while driving the motor 16 for the galvano mirror 15, and the motor for the table 13. In this way, unnecessary portions in the conductor layer 12m are removed, or a side face, the surface or the thickness of the resistance heating elements already formed as a pattern is trimmed to complete resistance heating elements 12 having a given pattern.

Thereafter, through the steps of connecting external terminals and setting temperature-measuring elements, and the like steps, the production of a ceramic heater finishes.

In this process, the conductor layer is formed on the ceramic substrate 11, and subsequently unnecessary portions are removed by a laser ray to obtain a heating element pattern. However, as described above, it is allowable to form a pattern of resistance heating elements beforehand, and then perform trimming in the thickness direction, a side face or the surface thereof, or trim some portions of a pattern in a ladder form.

For example, in the case that after a conductor containing paste layer for a heating element pattern is formed on a surface of a ceramic substrate or after a conductor layer for a heating element pattern is formed, subsequently a laser ray is applied to the conductor containing paste layer or the conductor layer to adjust the thickness of the resistance heating element, the laser ray is used not only to remove the conductor layer or the conductor containing paste layer but also to adjust the thickness of the conductor layer. That is, by forming a conductor layer 12m or a conductor containing paste layer for a heating element pattern on the ceramic substrate 11 and subsequently applying a laser ray to the whole of portions of the heating element pattern as illustrated in FIG. 2(a), the thickness of the conductor layer and so on can be adjusted, as illustrated in FIG. 2(b).

If the thickness of the conductor layer can be adjusted using such a method, the following advantages can be attained, for example: in the case that at the time of forming resistance heating elements, a part thereof becomes thick or the thickness thereof becomes, as a whole, larger than a designed value, the thickness of the resistance heating elements is made small to increase the resistance value (resistivity), thereby making the calorific value large; or in the case that resistance heating elements are formed as designed but the heat capacity of the ceramic substrate happened to be larger than a designed value, the thickness of the resistance heating elements is made small to increase the resistance value (resistivity), thereby making the calorific value large.

Since the calorific value of the resistance heating elements can be more precisely controlled in this way, the temperature on the heating face is more easily controlled.

Regarding the resistance value control, the resistance heating element 12 is divided to 2 or more sections ($l_1$ to $l_6$) and the resistance values of the respective sections are controlled, as illustrated in FIG. 13.

As illustrated in FIGS. 8 to 12, by forming a groove in a part of the resistance heating element, or by changing the length of the circuit, the resistance value can be controlled.

When unnecessary portions of the conductor layer etc. are to be removed, it is important factor that the unnecessary portions of the conductor layer etc. are completely removed by application of a laser ray thereto but the application of the laser ray does not produce a large effect on the ceramic substrate present below.

It is therefore necessary to select, as a laser ray, ray which is satisfactorily absorbed in metal particles etc. which constitute the conductor layer etc. but is not easily absorbed in the ceramic substrate. The kind of such a laser ray may be, for example, a YAG laser, a carbon dioxide laser, an excimer laser or UV (ultraviolet) laser, and the like.

Among these lasers, the YAG laser and the excimer (KrF) laser are optimal.

Also, the ceramic substrate 11 is preferably made of a material in which a laser ray is not easily absorbed. In the case of, for example, an aluminum nitride substrate, aluminum nitride whose carbon content is as small as 5000 ppm or less is preferable. The surface roughness of the surface is desirably set to 10 μm or less as the Ra according to JIS B0601. This is because when the surface roughness is large, a laser ray is absorbed thereon.

The YAG laser which can be adopted is SL432H, SL436G, SL432GT, SL411B made by NEC Corp and the like.

Figure 3:
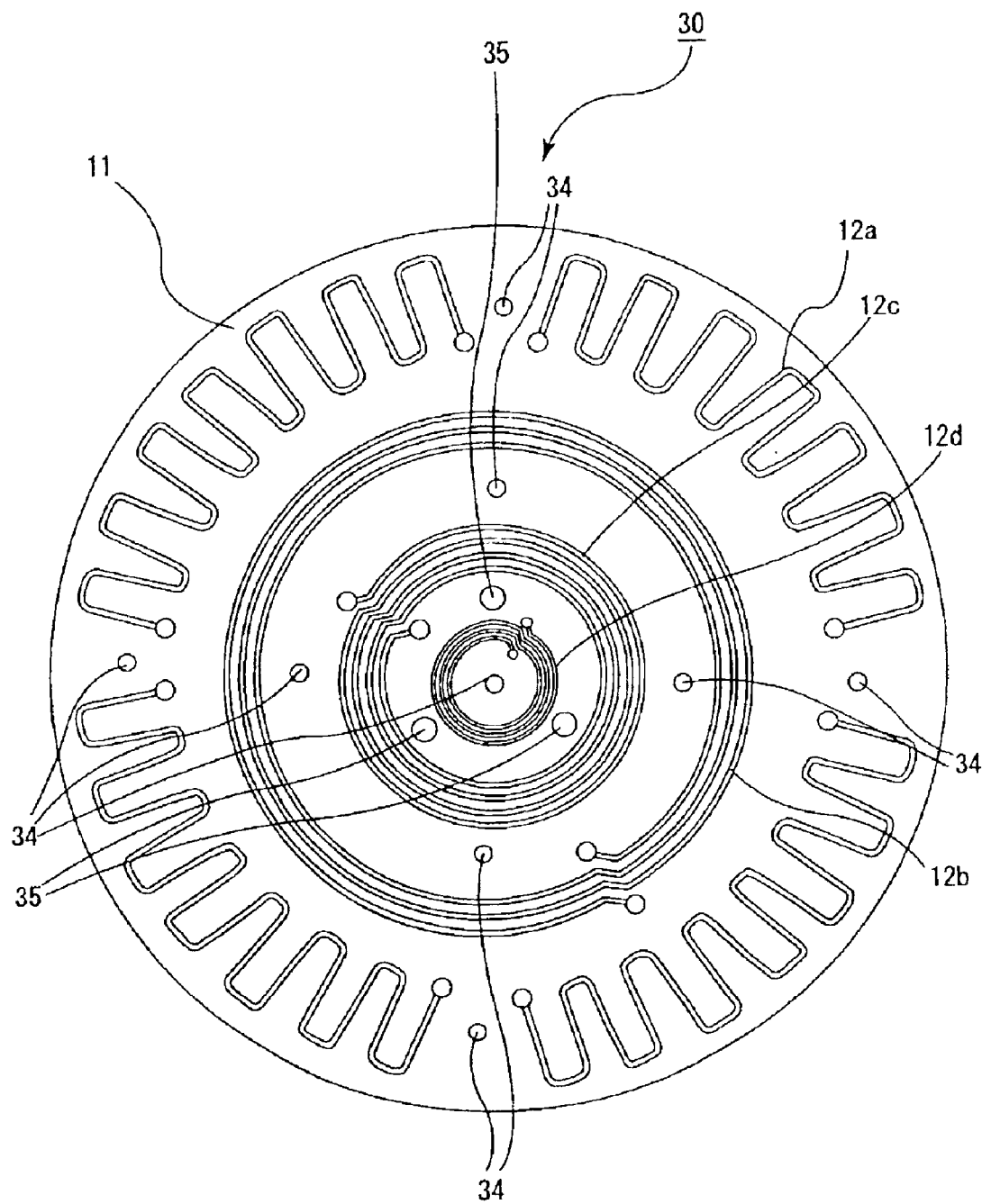
FIG. 3 is a plan view which schematically illustrates an example of a ceramic heater for a semiconductor producing/examining device produced by the process of producing a ceramic heater for a semiconductor producing/examining device of the present invention.
Figure 4:
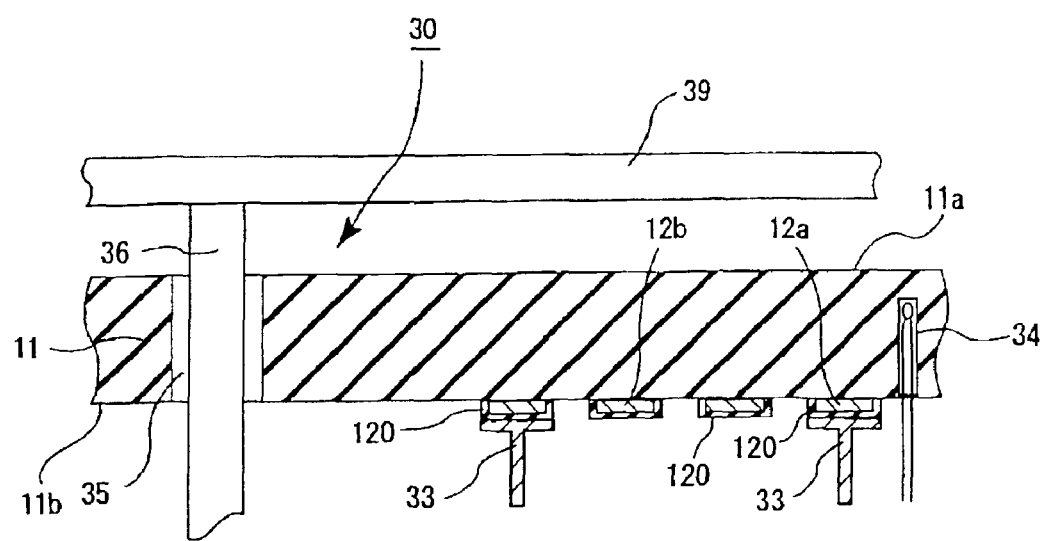
FIG. 4 is a partially enlarged sectional view which schematically illustrates a part of the ceramic heater for a semiconductor producing/examining device illustrated in FIG. 3.

FIG. 3 is a plane view which schematically illustrates the ceramic substrate 11 having the resistance heating elements 12 formed by the above-mentioned method, and FIG. 4 is a partially enlarged sectional view thereof.

In this ceramic heater 30, the resistance heating elements 12 (12a to 12d) comprises a pattern having a form of concentric circles-like and a pattern having a form of winding lines on a bottom face 11b of the ceramic substrate 11, in order to perform heating in such a manner that the temperature of the whole of the wafer-heating face 11a will be even.

In the case of a pattern having a wide interval between its wires, like the resistance heating elements 12a and 12b, the resistance heating elements are easier to be formed by screen printing. However, in the case of a pattern having a narrow interval, like the resistance heating elements 12c and 12d, or in the case that a pattern in the form of winding lines which have a narrow interval and are complicated is formed, it is effective to use a method of forming the resistance heating elements by the above-mentioned trimming with a laser ray.

In this ceramic heater 30, through holes 35, into which lifter pins 36 for carrying a silicon wafer 39 will be inserted, and bottomed holes 34, into which temperature-measuring elements will be inserted, are made at the portion near the center.

In the ceramic substrate 30 of the present invention, an object to be heated, such as the silicon wafer 39, is placed on the heating face 11a of the ceramic substrate 11 in the state that they contact each other, and is then heated. Besides, it is allowable to make the through holes 35 in the ceramic substrate 11, insert the lifter pins 36 into the through holes 35, and holding the object to be heated, such as the silicon wafer 39, by the lifter pins 36, thereby heating the object in the state that a constant interval is kept between the object and the ceramic substrate 11.

By moving the lifter pins 36 up and down, it is possible to receive the object to be heated such as the silicon wafer 39 from a carrier machine, place the object on the ceramic substrate 11, or heat the object while supporting the object.

Furthermore, it is allowable to make through holes or concave portions in the ceramic substrate, insert and fix supporting pins whose tips are in a pointed end form or semicircular form into the concave portions and the like in the state that the tips are slightly projected from the ceramic substrate surface, and support the object to be heated such as the silicon wafer 39 and the like by the supporting pins, thereby holding the object in the state that a constant interval is kept between the object and the ceramic substrate.

In the case that a resistance heating element is formed on the surface (bottom face) of a ceramic substrate as seen in the ceramic heater of the present invention, the heating face thereof is desirably present at the side opposite to the face on which the resistance heating element is formed. This is because the temperature-evenness on the heating face can be improved since the ceramic substrate acts in order to attain heat diffusion.

The ceramic substrate in the ceramic heater of the present invention is desirably in a disc form. The diameter thereof is desirably more than 190 mm. This is because dispersion in the temperature on the heating face becomes larger as such a diameter is larger.

The thickness of the ceramic substrate of the ceramic heater of the present invention is desirably 25 mm or less. This is because if the thickness of the ceramic substrate is more than 25 mm, the temperature following property thereof deteriorates.

The thickness is desirably more than 1.5 mm, and 5 mm or less. This is because: if the thickness is more than 5 mm, heat does not conduct thus, generating a tendency that heating efficiency deteriorates; and if the thickness is 1.5 mm or less, temperature dispersion on the heating face may be generated since heat conducting in the ceramic substrate does not diffuse sufficiently, or the strength of the ceramic substrate may drop so that the ceramic substrate may be broken.

In the ceramic heater 10 of the present invention, a ceramic is used as the material of the substrate. The ceramic is not particularly limited. Examples thereof include nitride ceramics, carbide ceramics, oxide ceramics and the like.

Among these ceramics, nitride ceramics or carbide ceramics is preferable as the materials of the ceramic substrate 11. This is because they have a high thermal conductivity.

Examples of the nitride ceramics include aluminum nitride, silicon nitride, boron nitride, titanium nitride and the like. Examples of the carbide ceramics include silicon carbide, titanium carbide, boron carbide and the like. Examples of the oxide ceramics include alumina, cordierite, mullite, silica, beryllia and the like. These ceramics may be used alone or in combination of two or more thereof.

Among these ceramics, aluminum nitride is most preferable since its thermal conductivity is highest, that is, 180 W/m·K.

However, in order that the ceramic substrate may not absorb a laser ray, the following contrivance is necessary: the amount of carbon therein is made small; the Ra according to JIS B0601 is set to 10 μm or less by grinding the surface; and the like. If necessary, a heat-resistant ceramic layer may be formed between the resistance heating element and the ceramic substrate. For example, in the case of a non-oxide type ceramic, an oxide ceramic may be formed on the surface thereof.

The resistance heating element formed on or inside the ceramic substrate is desirably divided into at least two circuits or more. By the division into the circuits, electric power supplied to the respective circuits can be controlled to change the calorific value thereof so that the temperature of the heated surface of a silicon wafer can be adjusted.

Examples of the pattern of the resistance heating elements include concentric circles, a spiral, eccentric circuits, and winding lines. The pattern in the form of concentric circuits-like, as illustrated in FIG. 1, or a combination of the form of concentric circuits-like and the form of winding lines is preferred since the pattern makes it possible to make the temperature of the entire ceramic substrate even.

The formation of the resistance heating elements using the above-mentioned laser ray is advantageous for the case in which a complicated pattern wherein an interval between its wires is narrow.

As the method of forming the resistance heating elements on the surface of the ceramic substrate, the above-mentioned method is used. That is, a conductor containing paste is applied to given areas in the ceramic substrate, next a conductor containing paste layer is formed, and subsequently a trimming treatment with a laser is performed; or a conductor containing paste is baked thereon and subsequently a trimming treatment with a laser is performed to form resistance heating elements having a given pattern. By firing, metal particles can be sintered on the surface of the ceramic substrate. The sintering of metal is sufficient if the metal particles are melted and adhered to each other and the metal particles and the ceramic are melted and adhered to each other. Trimming is optimally performed after the firing. This is because the resistance value can be more precisely controlled after the firing since the resistance value changes by the firing.

A method such as plating or sputtering may be used to form a conductor layer in given areas, and then this layer is subjected to a trimming treatment with a laser.

When the resistance hearing elements are formed on the surface of the ceramic substrate, the thickness of the resistance heating elements is preferably from 1 to 30 $\mu$m and more preferably from 1 to 10 $\mu$m. The width of the resistance heating elements is preferably from 0.1 to 20 mm and more preferably from 0.1 to 5 mm.

The resistance value of the resistance heating elements can be changed dependently on their width or thickness. The above-mentioned ranges are however most practical. The resistance value (volume resistivity) can be adjusted by the use of a laser ray, as described above.

The resistance heating elements may have a rectangular section, or an elliptical section. They desirably have a flat section. In the case of the flat section, heat is more easily radiated toward the heating face. Thus, a temperature distribution on the heating face is not easily generated.

The aspect ratio (the width of the resistance heating element/the thickness of the resistance heating element) of the section is desirably from 10 to 5000.

This is because adjustment thereof into this range makes it possible to increase the resistance value of the resistance heating elements and keep the evenness of the temperature on the heating face.

In the case that the thickness of the resistance heating elements is made constant, the amount of heat conduction toward the heating face of the ceramic substrate becomes small if the aspect ratio is smaller than the above-mentioned range. Thus, a thermal distribution similar to the pattern of the resistance heating elements is generated on the heating face. On the other hand, if the aspect ratio is too large, the temperature of the portions just above the centers of the resistance heating elements becomes high so that a thermal distribution similar to the pattern of the resistance heating elements is generated on the heating face. Accordingly, if temperature distribution is considered, the aspect ratio of the section is preferably from 10 to 5000.

The conductor containing paste is not particularly limited, and is preferably a paste comprising not only metal particles or an electrically conductive ceramic for keeping electrical conductivity but also a resin, a solvent, a thickener and so on.

The above-mentioned metal particles are preferably made of, for example, a noble metal (gold, silver, platinum or palladium), lead, tungsten, molybdenum, nickel and the like. These may be used alone or in combination of two or more. This is because these metals are not relatively easily oxidized, and have a resistance value sufficient for generating heat.

Examples of the above-mentioned electrically conductive ceramic include carbides of tungsten, molybdenum and the like. These may be used alone or in combination of two or more.

The particle diameter of these metal particles or the electrically conductive ceramic particles is preferably from 0.1 to 100 $\mu$m. If the particle diameter is too fine, that is, less than 0.1 $\mu$m, they are easily oxidized. On the other hand, if the particle diameter is over 100 $\mu$m, they are not easily sintered so that the resistance value becomes large.

The shape of the metal particles may be spherical or scaly. When these metal particles are used, they may be a mixture of spherical particles and scaly particles.

In the case that the metal particles are scaly or a mixture of spherical particles and scaly particles, metal oxides between the metal particles are easily retained and adhesion between the resistance heating elements and the nitride ceramic and the like is made sure. Moreover, the resistance value can be made large. Thus, this case is profitable.

Examples of the resin used in the conductor containing paste include an epoxy resin, a phenol resin and the like. Examples of the solvent are isopropyl alcohol and the like. Examples of the thickener are cellulose and the like.

It is desirable to add a metal oxide to the metal particles in the conductor containing paste and make a sintered body composed of the resistance heating elements, the metal particles and the metal oxide. By sintering the metal oxide together with the metal particles in this way, the nitride ceramic and the like which constitutes the ceramic substrate can be closely adhered to the metal particles.

The reason why the adhesion to the nitride ceramic and the like by mixing the metal oxide is improved is unclear, but would be based on the following. The surface of the metal particles, or the surface of the nitride ceramic and the like is slightly oxidized so that an oxidized film is formed. Pieces of this oxidized film are sintered and integrated with each other through the metal oxide so that the metal particles and the nitride ceramic and the like are closely adhered to each other. In the case that the ceramic constituting the ceramic substrate is an oxide ceramic, the surface thereof is naturally made of the oxide. Therefore, a conductor layer having excellent adhesion capability is formed.

A preferred example of the above-mentioned metal oxide is at least one selected from the group consisting of lead oxide, zinc oxide, silica, boron oxide ($B_2O_3$), alumina, yttria, and titania.

This is because these oxides make it possible to improve adhesion between the metal particles and the nitride ceramic and the like without increasing the resistance value of the resistance heating elements 12 too much.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The weight ratio is desirably adjusted within the scope that the total thereof is not over 100 parts by weight.

By adjusting the amounts of these oxides within these ranges, particularly adhesion to the nitride ceramic and the like can be improved.

The addition amount of the metal oxides to the metal particles is preferably from 0.1% by weight or more and less than 10% by weight. The area resistivity when the conductor containing paste having such a composition is used to form the resistance heating elements 12 is preferably from 1 to 45 mΩ/□.

This is because, if the area resistivity is more than 45 mΩ/□, the calorific value to an applied voltage becomes too large so that, in the ceramic substrate 11 wherein the resistance heating elements 12 are set on its surface, its calorific value is not easily controlled. If the addition amount of the metal oxides is 10% or more by weight, the area resistivity exceeds 50 mΩ/□ so that the calorific value becomes too large. Thus, temperature-control is not easily performed so that the evenness in temperature distribution deteriorates.

If necessary, the area resistivity can be set to 50 mΩ/□ to 10 Ω/□. If the area resistivity is made large, the width of the pattern can be made wide. Therefore, a problem of disconnection does not arise.

In the case that the resistance heating elements are formed on the surface of the ceramic substrate, a metal covering layer is preferably formed on the surfaces of the resistance heating elements. This is because the metal covering layer prevents a change in the resistance value based on oxidization of the inner metal sintered product. The thickness of the formed metal covering layer is preferably from 0.1 to 10 $\mu$m.

The metal used when the metal covering layer is formed is not particularly limited if the metal is a non-oxidizable metal. Specific examples thereof include gold, silver, palladium, platinum, nickel and the like. These may be used alone or in combination of two or more. Among these metals, nickel is preferred.

This is because: the resistance heating elements need to have terminals for connection to a power source, and the terminals are attached to the resistance heating element through solder, at that time nickel prevents thermal diffusion in the solder. As the connecting terminals, external terminals made of Kovar can be used.

Figure 5:
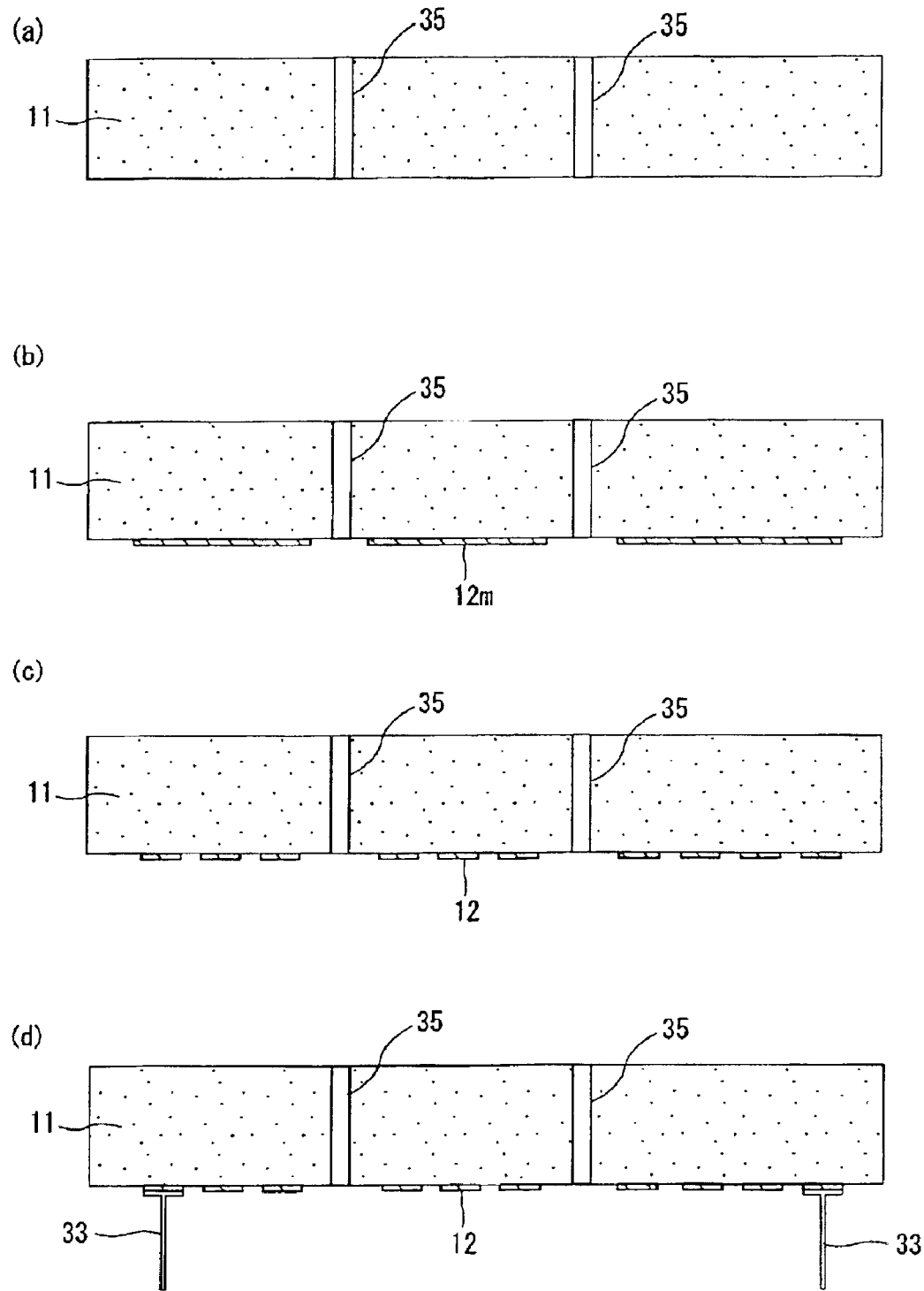
FIGS. 5(a) to 5(d) are sectional views which schematically illustrate some parts of the process of producing a ceramic heater for a semiconductor producing/examining device.

Referring to FIG. 5, regarding the process for producing a ceramic heater of the present invention including a laser treatment, the following will describe steps other than a laser treatment step in more detail. Since the laser treatment step has previously described in detail, the step will briefly be described herein.

FIGS. 5(a) to (d) are sectional views which schematically show some parts of the process for producing a ceramic heater of the present invention, including a laser treatment.
(1) Step of Forming a Ceramic Substrate If necessary, a sintering aid such as yttria ($Y_2O_3$), a compound containing Na or Ca, a binder and so on are blended with powder made of a ceramic such as aluminum nitride, to prepare a slurry. Thereafter, this slurry is made into a granular form by spray-drying and the like method. The granule is put into a mold and the like and pressed to be formed into a plate form and the like form. Thus, a raw formed body (green) is formed.

Next, portions which will be through holes 35, into which lifter pins 36 for carrying an object to be heated such as a silicon wafer 39 will be inserted; portions which will be bottomed holes, in which temperature-measuring elements such as thermocouples will be embedded; and so on are made in the raw formed body if necessary.

Next, this raw formed body is heated and fired to be sintered. Thus, a plate made of the ceramic is manufactured. Thereafter, the plate is made into a given shape to manufacture a ceramic substrate 11 (reference to FIG. 5(a)). The shape of the raw formed body may be such a shape that the fired body can be used as it is. For example, by heating and firing the raw formed body while pressing the body from the upper and lower sides, the ceramic substrate 11 having no pores can be manufactured. It is sufficient that the heating and the firing are performed at sintering temperature or higher. The firing temperature is from 1000 to 2500° C., for example, for a nitride ceramic.

Usually, after the firing, through holes 35, and bottomed holes (not illustrated) into which temperature-measuring elements will be inserted are made. The through holes 35 etc. can be made by blasting treatment such as sandblast with SiC particles after grinding of the surface.
(2) Step of Printing a Conductor Containing Paste on the Ceramic Substrate A conductor containing paste is generally a fluid comprising metal particles, a resin and a solvent, and has a high viscosity. This conductor containing paste is printed in the whole of areas where resistance heating elements are to be arranged by screen printing and the like, to form a conductor containing paste layer 12m (FIG. 5(b)).

Since it is necessary that the pattern of the resistance heating elements make the temperature of the whole of the ceramic substrate even, the pattern is desirably a pattern comprising concentric circles and winding lines, as shown in FIG. 3. The conductor containing paste layer is made into a pattern in the form of wide concentric circles or in the form of a circle, so as to include the above-mentioned pattern.
(3) Firing of the Conductor Containing Paste The conductor containing paste layer printed on the bottom face of the ceramic substrate 11 is heated and fired to remove the resin and the solvent and sinter the metal particles. Thus, the metal particles are baked onto the bottom face of the ceramic substrate 11 to form a conductor layer having a given width (reference to FIG. 1). Thereafter, the above-mentioned trimming treatment with a laser is performed, to form resistance heating elements 12 having a given pattern (reference to FIG. 5(c)). The heating and firing temperature is preferably from 500 to 1000° C.

It is allowable to form a pattern of concentric circles or a spiral, a winding line pattern, and the like pattern firstly and trim a part thereof, thereby forming the resistance heating elements 12.
(4) Formation of a Metal Covering Layer As illustrated in FIG. 4, a metal covering layer 120 is desirably formed on the surface of the resistance heating elements 12. The metal covering layer 120 can be formed by electroplating, electroless plating, sputtering and the like. Considering mass productivity, electroless plating is best. In FIGS. 5, the metal covering layer 120 is not shown.
(5) Fitting of External Terminals and so on Terminals (external terminals 33) for connection to a power source are fitted up to ends of the pattern of the resistance heating elements 12 with solder (reference to FIG. 5(d)). Thermocouples are fixed into the bottomed holes 34, and sealed with heat resistant resin and the like, so as to finish the production of a ceramic heater.

The ceramic heater of the present invention can be used as an electrostatic chuck by setting up electrostatic electrodes inside the ceramic substrate, or can be used as a wafer prober by setting a chuck top conductor layer on the surface of the ceramic substrate and setting guard electrodes and ground electrodes inside.

The following will describe the invention wherein a conductor layer and so on are subjected to trimming and the like, using a grinding device. This invention is a process of producing a ceramic heater, wherein after forming a conductor layer on a given area of a surface of a ceramic substrate, a heating element pattern is formed by trimming the conductor layer in a way of performing a grinding treatment.

The ceramic substrate used in the present invention is the same as the one described above. The method of forming the conductor layer on the given area of a surface of the ceramic substrate also is the same as the one described above.

After the conductor layer is formed in the given area on the ceramic substrate in such a way, a mask which is formed to cover portions which will be a heating element pattern is placed on the surface of the ceramic substrate. Subsequently, a grinding treatment is performed to remove the conductor layer other than the heating element pattern. Thus, the heating element pattern is formed.

Alternatively, after this, the surface of the heating element pattern exposed from a mask may be ground to adjust the thickness thereof.

Figure 6:
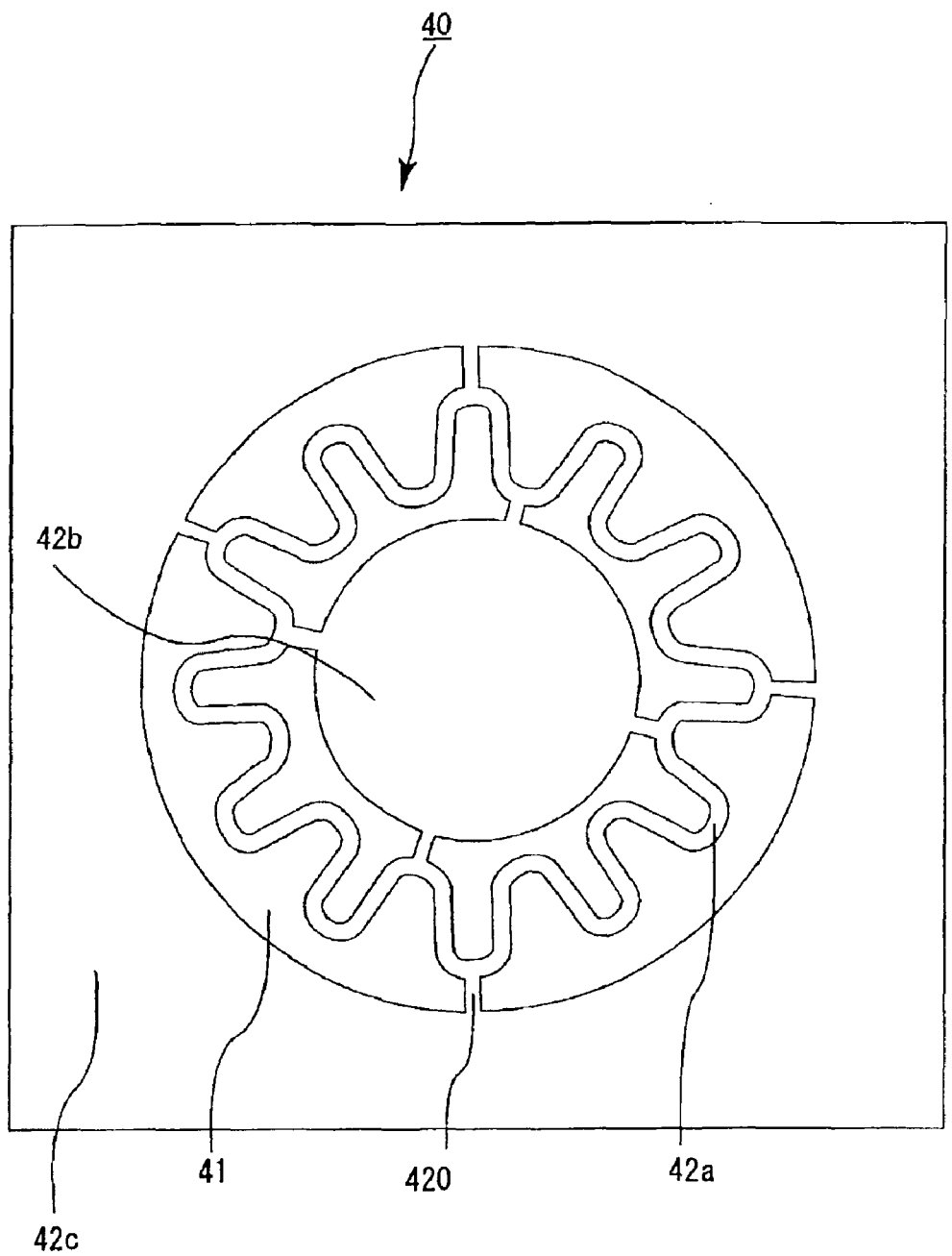
FIG. 6 is a plan view which schematically illustrates a mask used in the process for producing a ceramic heater for a semiconductor producing/examining device of the present invention.

FIG. 6 is a plane view which schematically illustrates the mask used when such a grinding treatment is conducted.

In this mask 40, an opening 41 is formed so as to overlap the portion where the conductor layer in a ring form on the ceramic substrate is formed, and a mask portion 42a having a pattern of a resistance heating element is formed inner portion of the opening. A connection portion 420 is formed to connect the mask portion 42a with: inside mask portion 42b; and outside mask portion 42c.

Therefore, the mask 40 is placed and fixed onto the ceramic substrate so that the opening 41 and the conductor layer overlap with each other. The ceramic substrate is then ground, whereby the conductor layer in portions other than the heating element pattern can be removed. In this way, the resistance heating element pattern can be formed.

However, the portion corresponding to the connection portion 420 of the mask 40 is not removed and remains; therefore, it is necessary that only the portion is removed afterwards.

Figure 7:
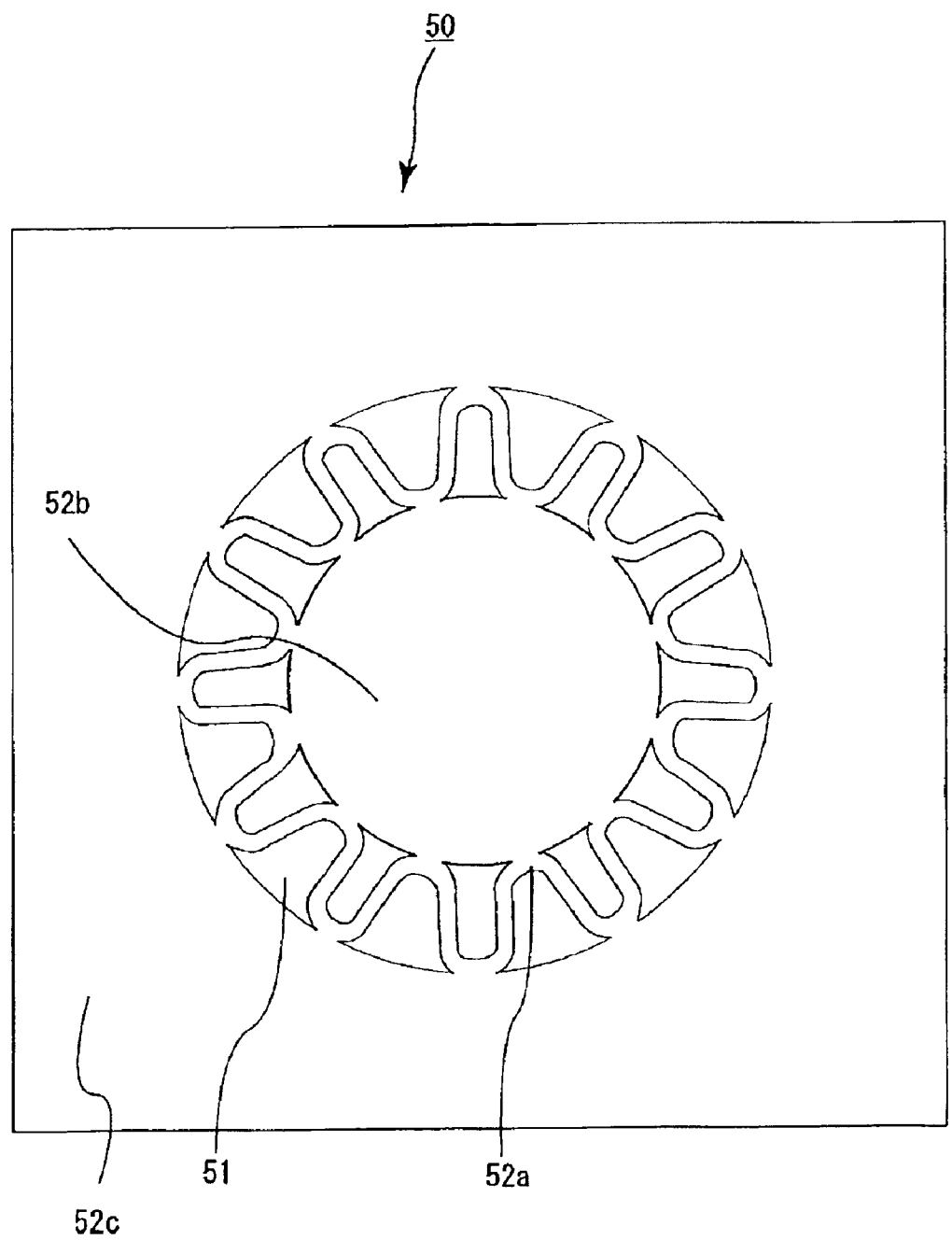
FIG. 7 is a plan view which schematically illustrates another mask used in the process for producing a ceramic heater for a semiconductor producing/examining device of the present invention.

Also, in a case that: a mask 50 is formed in such a manner that: as illustrated in FIG. 7, the inside end and the outside end of the mask portion 52a of the heating element pattern are directly connected to the inside mask portion 52b and outside mask portion 52c of the opening 51, respectively; and the conductor layer is formed on the ceramic substrate so as to overlap with ends of the pattern of the heating element of the mask, it is unnecessary to remove the connection portion afterward.

The mask 40 is preferably made of a material which is not easily ground by a grinding device. For example, examples thereof include stainless steel, nickel, copper and the like.

The thickness thereof is preferably from 5 to 2000 $\mu$m.

The grinding device which can be used is usually a device used to grind the surface of the ceramic substrate. Sandblast or a belt sander (reference to FIG. 14) can be used. Examples of abrasive material include fine diamond power, SiC, alumina, zirconia and the like.

After the formation of the resistance heating elements in a usual way, the thickness of the resistance heating elements may be adjusted by performing a grinding treatment. By performing a grinding treatment more weakly than in the case that the conductor layer is removed as described above, the thickness of the resistance heating elements can be adjusted.

Figure 14:
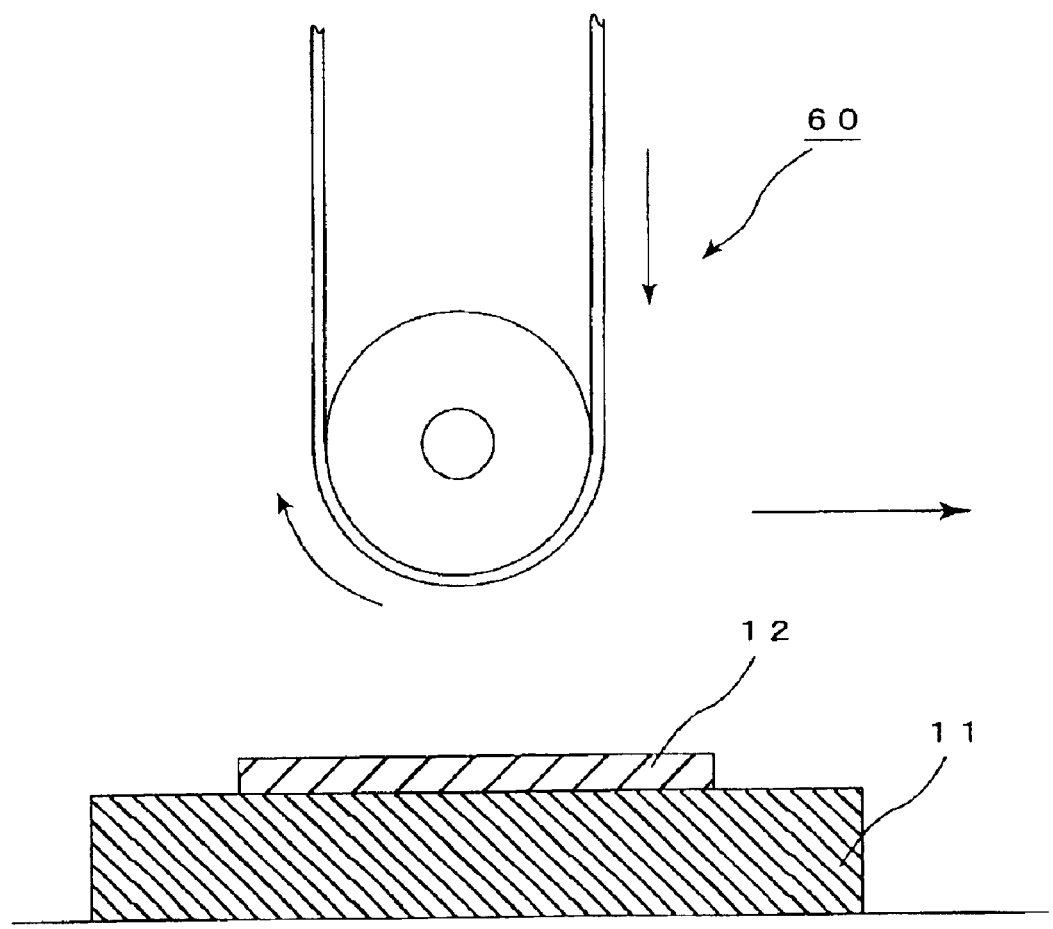
FIG. 14 is a sectional view which schematically illustrates a situation in which a resistance heating element is subjected to belt sander grinding.

In this case, it is not particularly necessary to use any mask, and grinding may be performed by means of a belt sander as illustrated in FIG. 14. Since a wide area can be ground in this case, the thickness of the resistance heating elements are more easily adjusted.

BEST MODE FOR CARRYING OUT THE INVENTION

The present invention will be described in more detail hereinafter.

EXAMPLE 1

Production of a Ceramic Heater (Removal of Some Parts of a Conductor Containing Paste Layer by Irradiation Thereof with a Laser Ray, see FIG. 1)

(1) A composition made of 100 parts by weight of aluminum nitride powder (average particle diameter: 1.1 $\mu$m), 4 parts by weight of yttria (average particle diameter: 0.4 $\mu$m), 12 parts by weight of an acrylic binder, and an alcohol was subjected to spray-drying to obtain granular powder.

(2) Next, this granular powder was put into a mold and formed into a flat plate form, to obtain a raw formed body (green).

(3) Next, this raw formed body was hot-pressed at 1800° C. and a pressure of 20 MPa, to obtain an aluminum nitride plate having a thickness of about 3 mm.

Next, this plate was cut out into a disc having a diameter of 210 mm to prepare a plate made of the ceramic (ceramic substrate 11). This ceramic substrate was drilled to make through holes 15, into which lifter pins 16 for a silicon wafer would be inserted, and bottomed holes 14 (diameter: 1.1 mm, and depth: 2 mm), in which thermocouples would be embedded (FIG. 5($a$)).

(4) A conductor containing paste layer was formed on the ceramic substrate 11 obtained in the above-mentioned (3) by screen printing. The printed pattern was a pattern comprising a circle and a concentric circle having a given width, which were coated so as to include respective circuits of resistance heating elements to be formed (reference to FIG. 5($b$)).

The conductor containing paste was Solvest PS603D made by Tokuriki Kagaku Kenkyu-zyo, which is used to form plated through holes in print circuit boards.

This conductor containing paste was a silver-lead paste and contained 7.5 parts by weight of oxides made of lead oxide (5% by weight), zincoxide (55% by weight), silica (10% by weight), boron oxide (25% by weight) and alumina (5% by weight) per 100 parts by weight of silver. The silver particles had an average particle diameter of 4.5 $\mu$m, and were scaly.

(5) Furthermore, the ceramic substrate 11 was heated and fired at 780° C. after the formation of the conductor containing paste layer in a heating element pattern, so as to sinter silver and lead in the conductor containing paste and bake them onto the ceramic substrate 11.

(6) Next, a YAG laser (S143AL made by NEC Corp., power: 5 W, and pulse frequency: 0.1 to 40 kHz) having a wavelength of 1060 nm was used to perform trimming. This equipment has an X-Y stage, a galvano mirror, a CCD camera, and a Nd:YAG laser, and has therein a controller for controlling the stage and the galvano mirror. The controller was connected to a computer (FC-9821, made by NEC Corp.). The computer has a CPU functioning as both of an operation unit and a memory unit. The computer also has a hard disc and a 3.5-inch FD driver functioning as both of a memory unit and an input unit.

Heating element pattern data were input from the FD driver to this computer, and further the position of the conductor layer was read out (on the basis of markers, as standards, which is formed at specified positions on the conductor layer or on the ceramic substrate). Necessary control data were calculated, and a laser ray was applied to portions other than a region of the conductor containing paste layer where a heating element pattern was to be formed, so as to remove the above-mentioned portions of the conductor containing paste layer. In this way, resistance heating elements 12 were formed (reference to FIG. 5(c)). The resistance heating elements made of silver-lead had a thickness of 5 μm, a width of 2.4 mm, and an area resistivity of 7.7 mΩ/□.

(7) The ceramic substrate 11 formed in the above-mentioned (6) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 12a having a thickness of 1 μm on the surface of the silver-lead resistance heating elements 12.

(8) A silver-lead solder paste (made by Tanaka Noble Metals) was printed, by screen printing, on portions to which external terminals 33 for ensuring connection to a power source were attached, to form a solder layer.

Next, the external terminals 33 made of Kovar were put on the solder layer and heated and reflowed at 420° C. to attach the external terminals 33 onto the surface of the resistance heating elements 12 (reference to FIG. 5(d)).

(9) Thermocouples for controlling temperature were sealed thereto with polyimide, to obtain a ceramic heater 10.

Electric current was passed through the ceramic heater obtained through the above-mentioned steps. As a result, no short circuit was generated. The temperature of the ceramic substrate could be raised as planned. The temperature on the heating face of the ceramic substrate after the temperature-rising was also even.

EXAMPLE 2

Production of a Ceramic Heater (Removal of Some Parts of a Conductor Layer by Irradiation Thereof with a Laser Ray)

(1) In the same way as in Example 1, a ceramic substrate 11 was manufactured. Thereafter, this ceramic substrate was drilled to make through holes 15, into which lifter pins 16 for a silicon wafer would be inserted, and bottomed holes 14 (diameter: 1.1 mm, and depth: 2 mm), in which thermocouples would be embedded.

(2) Next, a conductor containing paste was printed on the ceramic substrate by screen printing. The printed pattern was a pattern made of concentric circles having a given width, which were coated to include respective circuits of resistance heating elements to be formed. As the conductor containing paste, the same as in Example 1 was used.

(3) After the conductor containing paste layer in the form of the concentric circuits having the given width was formed in this way, the ceramic substrate 11 was heated and fired at 780° C. to sinter silver and lead in the conductor containing paste and bake them on the ceramic substrate 11. In this way, a conductor layer having the pattern in the form of the concentric circles having the given width was formed.

The resistance heating elements of silver-lead had a thickness of 5 μm and an area resistivity of 7.7 mΩ/□.

(4) Next, High Milliohm Tester 3220 made by Hioki Co., Ltd. as a resistance measuring device was connected to the computer of the YAG laser equipment used in Example 1. This tester has a probe pin and can measure the resistance value (resistivity) of the resistance heating elements Thus, the resistance heating elements were divided to 100 sections. The probe pin of the tester was brought into contact with each of the sections thereof to measure the resistance value (resistivity). The results were stored in the memory unit of the computer.

Furthermore, desired resistance values, pattern data and trimming data were input from an FD, and then trimming control data for obtaining given resistance values were calculated in the operation unit. By the control data, a laser ray was applied to given positions of the heating element pattern to remove the surface or a part of a side face of the conductor layer in the laser-applied portions, thereby obtaining resistance heating elements 12 having a pattern as designed. The width of the resultant resistance heating elements was 2.4 mm.

(5) The ceramic substrate 11 formed in the above-mentioned (4) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 120 having a thickness of 2 μm on the surface of the silver-lead resistance heating elements 12.

(6) A solder paste (made by Tanaka Noble Metals) was printed, by screen printing, on portions to which external terminals 33 for ensuring connection to a power source were attached, to form a solder layer.

Next, the external terminals 33 made of Kovar were put on the solder layer and heated and reflowed at 420° C. to attach the external terminals 33 onto the surface of the resistance heating elements 12.

(7) Thermocouples for controlling temperature were sealed thereto with polyimide, to obtain a ceramic heater 10.

Electric current was passed through the ceramic heater obtained through the above-mentioned steps. As a result, no short circuit was generated. The temperature of the ceramic substrate could be raised as planned. The temperature on the heating face of the ceramic substrate after the temperature-rising was also even.

EXAMPLE 3

Production of a Ceramic Heater (Adjustment of the Thickness of a Conductor Layer by Irradiation Thereof with a Laser Ray)

Substantially the same process as in Example 2 was performed, but the pattern of the conductor containing paste formed on the surface of the ceramic substrate was changed to a heating element pattern and resistance heating elements having a given pattern were formed on the ceramic substrate by firing. The resistance heating elements had a width of 2.4 mm and an average thickness of 7 μm.

Next, the resistance value (resistivity) of the resistance heating elements was actually measured, and then: portions having a low resistance value was adjusted by trimming with a laser ray to have a thickness of 5 μm; and portions having a high resistance was adjusted by trimming with a laser ray to have a thickness of 6 μm.

Electric current was passed through the ceramic heater obtained through the above-mentioned steps. As a result, no short circuit was generated. The temperature of the ceramic substrate could be raised as planned. The temperature on the heating face of the ceramic substrate after the temperature-rising was also even.

EXAMPLE 4

Production of a Ceramic Heater (Removal of Some Parts of a Conductor Layer by Grinding)

(1) In the same way as in Example 1, a ceramic substrate 11 was manufactured. Thereafter, this ceramic substrate was drilled to make through holes 15, into which lifter pins 16 for a silicon wafer would be inserted, and bottomed holes 14 (diameter: 1.1 mm, and depth: 2 mm), in which thermocouples would be embedded.

(2) Next, a conductor containing paste was printed on the ceramic substrate by screen printing. The printed pattern was a pattern made of concentric circles having a given width, which were coated to include respective circuits of resistance heating elements to be formed. As the conductor containing paste, the same as in Example 1 was used.

(3) After the conductor containing paste layer having the given width was formed in this way, the ceramic substrate 11 was heated and fired at 780° C. to sinter silver and lead in the conductor containing paste and bake them on the ceramic substrate 11. In this way, a conductor layer having the pattern in the form of the concentric circles having the given width was formed.

The resistance heating elements of silver-lead had a thickness of 5 μm and an area resistivity of 7.7 mΩ/□.

(4) Next, a mask having a pattern wherein: an opening corresponding to the portion where the conductor layer was formed was formed; and a mask portion having a pattern of a heating element was formed inner portion of the opening, was placed on the ceramic substrate. The mask was securely fixed thereon, and subsequently a grinding treatment by sandblast with SiC particles having an average particle diameter of 3 μm was effected through the stainless steel mask to the ceramic substrate, to remove the conductor layer in portions other than the heating element pattern portion. The mask was made of stainless steel and had a thickness of 0.5 mm.

By this grinding step, resistance heating elements having a pattern as just designed were obtained. The width of the resistance heating elements was 2.4 mm.

In this case, the mask having a shape as shown in FIG. 7 was used. It was therefore unnecessary to perform grinding two times.

(5) Next, the ceramic substrate 11 formed in the above-mentioned (4) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) having a thickness of 1 μm on the surface of the silver-lead resistance heating elements.

(6) A silver-lead solder paste (made by Tanaka Noble Metals) was printed, by screen printing, on portions to which external terminals 33 for ensuring connection to a power source were attached, to form a solder layer.

Next, the external terminals 33 made of Kovar were put on the solder layer and heated and reflowed at 420° C. to attach the external terminals 33 onto the surface of the resistance heating elements 12.

(7) Thermocouples for controlling temperature were sealed thereto with polyimide, to obtain a ceramic heater 10.

Electric current was passed through the ceramic heater obtained through the above-mentioned steps. As a result, no short circuit was generated. The temperature of the ceramic substrate could be raised as planned. The temperature on the heating face of the ceramic substrate after the temperature-rising was also even.

EXAMPLE 5

Production of a Ceramic Heater (Adjustment of the Thickness of a Conductor Layer by Grinding)

In the same way as in Example 4 except the following steps, a ceramic heater was produced. In the steps of (1) to (4), resistance heating elements having a given pattern was formed on a ceramic substrate, so as to have a thickness of 6 μm. Thereafter, portions where the resistance heating elements were formed were ground with a belt sander 60. The thickness thereof was adjusted to 5 μm.

The grinding treatment was performed under the following conditions: the width of a wrapping tape upon the grinding: 500 mm, abrasive particles: #4000, grinding load: 18 kg, moving speed of the ceramic heater: 300 mm/minute, moving speed of the tape: 600 mm/minute, and the hardness of a contact roller rubber: 60 degrees.

Figure 15:
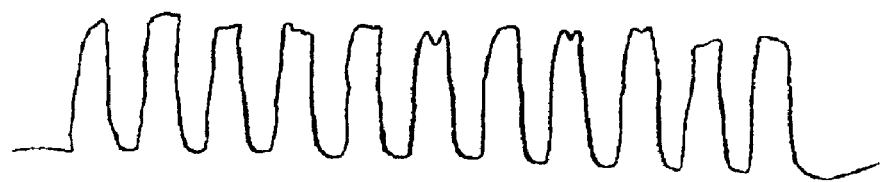
FIG. 15(a) is a chart showing the thickness of a resistance heating element after grinding.
FIG. 15(b) is a chart of the thickness of the resistance heating element before the grinding.
Figure 15:
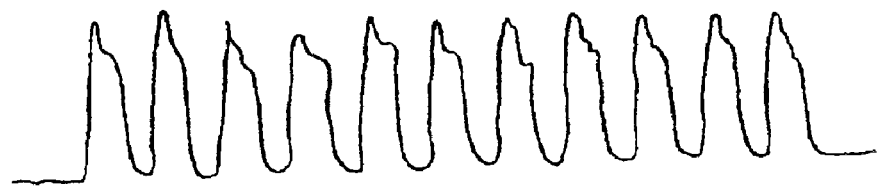

Charts obtained by measuring the thickness of the heating element pattern with a surface roughness meter are shown in FIGS. 15(*a*) and (*b*). FIG. 15(*b*) shows the chart before the grinding, and FIG. 15(*a*) shows the chart after the grinding. It can be understood that the thickness was even (dispersion in the thickness was adjusted to 10% or less).

Electric current was passed through the ceramic heater obtained through the above-mentioned steps. As a result, no short circuit was generated. The temperature of the ceramic substrate could be raised as planned. The temperature on the heating face of the ceramic substrate after the temperature-rising was also even.

COMPARATIVE EXAMPLE 1

In the same way as in Example 3, a ceramic substrate having resistance heating elements was produced. However, trimming with a laser ray was not performed.

Specifically, its temperature was raised to 300° C., and was then measured with a thermo viewer (IR-162012-0012, made by JEOL Datum LTD) to calculate a difference ΔT between the lowest temperature and the highest temperature.

The difference was 3° C. in Example 1, 2° C. in Example 2, 2° C. in Example 3, 3° C. in Example 4, 3° C. in Example 5, and 6° C. in Comparative Example 1.

In the ceramic heaters obtained in the above-mentioned Examples, precise patterns were formed. The thickness thereof can be adjusted. Therefore, the flexibility of heater design increases, and a ceramic heater having more precise characters can be produced. The evenness of temperature in its heating face is also superior.

INDUSTRIAL APPLICABILITY

As described above, according to the present invention, a ceramic heater having excellent evenness of temperature in its heating face is obtained, and the flexibility of heater design is improved. Since it is unnecessary to consider the printing precision of its resistance heating elements, productivity is also superior. Moreover, the resistance value of products is can be amended, and thus the generation of defective products can be decreased.

What is claimed is:

1. A process for producing a ceramic heater, comprising:
   forming a resistance heating element on a surface of a ceramic substrate by printing conductor containing paste on the surface of the ceramic substrate and firing;
   dividing the resistance heating element into plural sections;
   measuring a resistivity of each of said plural sections; and
   trimming the resistance heating element after firing so as to adjust the resistivity of each of said plural sections to a desired value.

2. The process for producing a ceramic heater according to claim 1,
   wherein the trimming step includes trimming a side face of the resistance heating element.

3. The process for producing a ceramic heater according to claim 1,
wherein the trimming step includes trimming a surface of the resistance heating element.

4. The process for producing a ceramic heater according to claim 1,
wherein said ceramic substrate comprises a nitride ceramic or a carbide ceramic.

5. The process for producing a ceramic heater according to claim 1,
wherein said ceramic substrate has Ra of 10 μm or less according to JIS B0601.

6. The process for producing a ceramic heater according to claim 1,
wherein the resistance heating element has a thickness of 1 to 30 μm.

7. The process for producing a ceramic heater according to claim 1,
wherein the resistance heating element comprises at least two circuits.

8. The process for producing a ceramic heater according to claim 1,
wherein said ceramic substrate has a disc shape and has a diameter of 190 mm or more.

9. The process for producing a ceramic heater according to claim 1,
wherein said ceramic substrate has a thickness of 1.5 to 5 mm.

10. The process for producing a ceramic heater according to claim 1, wherein the trimming includes applying a laser light to the resistance heating element.

11. The process for producing a ceramic heater according to claim 1, wherein the trimming includes grinding a surface of the resistance heating element.

12. The process for producing a ceramic heater according to claim 1, wherein the resistance heating element is configured to provide sufficient heat for at least one of producing and examining a semiconductor device.

* * * * *